(12) United States Patent
Brault et al.

(10) Patent No.: US 11,245,375 B2
(45) Date of Patent: *Feb. 8, 2022

(54) SYSTEM FOR CONFIGURATION AND STATUS REPORTING OF AUDIO PROCESSING IN TV SETS

(71) Applicant: THAT Corporation, Milford, MA (US)

(72) Inventors: Timothy Brault, Easthampton, MA (US); Fen Xu, Boston, MA (US); Matthew Easley, Woodstock, GA (US)

(73) Assignee: THAT CORPORATION, Milford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/366,406

(22) Filed: Mar. 27, 2019

(65) Prior Publication Data

US 2019/0305742 A1 Oct. 3, 2019

Related U.S. Application Data

(63) Continuation-in-part of application No. 15/862,045, filed on Jan. 4, 2018, now Pat. No. 10,652,689.

(Continued)

(51) Int. Cl.
*H03G 9/02* (2006.01)
*H03G 9/00* (2006.01)
(Continued)

(52) U.S. Cl.
CPC ............. *H03G 9/025* (2013.01); *H03G 5/165* (2013.01); *H03G 9/005* (2013.01); *H04R 3/04* (2013.01);
(Continued)

(58) Field of Classification Search
CPC ........ H03G 5/165; H03G 9/005; H03G 3/002; H03G 3/02; H03G 5/005; H03G 5/02;
(Continued)

(56) References Cited

U.S. PATENT DOCUMENTS

| 4,748,669 A | 5/1988 | Klayman |
| 5,054,071 A | 10/1991 | Bacon |

(Continued)

FOREIGN PATENT DOCUMENTS

| CN | 1254153 C | 4/2006 |
| CN | 102273224 | 12/2011 |

(Continued)

OTHER PUBLICATIONS

U.S. Appl. No. 12/949,397, filed Nov. 18, 2010, 15 pages.

(Continued)

*Primary Examiner* — Sunita Joshi
*Assistant Examiner* — Kuassi A Ganmavo
(74) *Attorney, Agent, or Firm* — Daly, Crowley, Mofford & Durkee, LLP

(57) ABSTRACT

Systems are disclosed including a television (TV) set having included audio system. The TV set permits control over various functions, at least including audio volume, via a remote control. When the viewer activates the remote volume control, a graphic appears indicating the state of the volume control and, optionally the mute status. The graphic can be presented on the TV screen. In alternate embodiments, the graphic may be presented on a display of the remote, or even some other location, e.g., a different remote control. If a mute button is provided on the remote control, when the viewer activates the mute button, a graphic appears indicating the state of muting and, optionally, the volume control status. The TV set also offers control over various aspects of the audio system, including settings which go beyond volume up/down, generally through some sort of menu system.

6 Claims, 16 Drawing Sheets

Related U.S. Application Data

(60) Provisional application No. 62/442,195, filed on Jan. 4, 2017, provisional application No. 62/649,461, filed on Mar. 28, 2018.

(51) Int. Cl.
  *H03G 5/16* (2006.01)
  *H04R 3/04* (2006.01)
  *H04S 7/00* (2006.01)
  *H04R 3/14* (2006.01)
  *H04N 5/445* (2011.01)
  *H04N 5/76* (2006.01)
  *H04S 1/00* (2006.01)
  *H03G 11/00* (2006.01)
  *H03G 5/02* (2006.01)
  *H04N 9/88* (2006.01)

(52) U.S. Cl.
  CPC ............. *H03G 5/02* (2013.01); *H03G 11/008* (2013.01); *H04N 5/445* (2013.01); *H04N 5/76* (2013.01); *H04N 9/88* (2013.01); *H04R 3/14* (2013.01); *H04S 1/002* (2013.01); *H04S 1/007* (2013.01); *H04S 7/30* (2013.01)

(58) Field of Classification Search
  CPC ........ H03G 5/025; H03G 11/008; H04R 3/04; H04R 3/14; H04S 1/002; H04S 1/007; H04S 7/30; H04S 7/305; H04N 5/445; H04N 5/4852; H04N 5/4403; H04N 5/76; H04N 9/88
  See application file for complete search history.

(56) References Cited

U.S. PATENT DOCUMENTS

| | | | |
|---|---|---|---|
| 5,278,909 A | 1/1994 | Edgar | |
| 5,295,189 A | 3/1994 | Fosgate | |
| 5,708,718 A | 1/1998 | Ambourn | |
| 7,031,474 B1 | 4/2006 | Yuen et al. | |
| 7,149,313 B1 | 12/2006 | Allen | |
| 8,315,411 B2 | 11/2012 | Hanna et al. | |
| 9,380,385 B1 | 6/2016 | Skinner et al. | |
| 2003/0023429 A1 | 1/2003 | Claesson | |
| 2003/0098805 A1* | 5/2003 | Bizjak | H03G 7/002 341/139 |
| 2006/0007358 A1* | 1/2006 | Kim | H04N 21/4854 348/553 |
| 2006/0098827 A1* | 5/2006 | Paddock | H03G 9/18 381/106 |
| 2006/0126851 A1 | 6/2006 | Yuen | |
| 2008/0049944 A1 | 2/2008 | Omata | |
| 2008/0095378 A1 | 4/2008 | Hanna | |
| 2008/0184868 A1* | 8/2008 | Transeau | G10H 1/0008 84/609 |
| 2009/0022328 A1 | 1/2009 | Neugebauer | |
| 2009/0262256 A1* | 10/2009 | Asayama | H04N 21/42204 348/738 |
| 2009/0287496 A1* | 11/2009 | Thyssen | H03G 7/007 704/500 |
| 2010/0046765 A1* | 2/2010 | De Bruijn | H03G 3/001 381/58 |
| 2010/0086149 A1 | 4/2010 | Kuroda | |
| 2010/0128904 A1* | 5/2010 | Hanna | H04R 5/04 381/107 |
| 2010/0158259 A1 | 6/2010 | Hanna et al. | |
| 2010/0188586 A1* | 7/2010 | Tsubouchi | H04N 5/44513 348/738 |
| 2011/0196519 A1 | 8/2011 | Khoury | |
| 2011/0280407 A1 | 11/2011 | Skinner | |
| 2013/0108055 A1 | 5/2013 | Hanna et al. | |
| 2013/0142339 A1 | 6/2013 | Engdegard | |
| 2014/0185829 A1 | 7/2014 | Bongiovi | |
| 2014/0270281 A1* | 9/2014 | Walsh | H04S 3/02 381/300 |
| 2014/0376726 A1 | 12/2014 | Trammel | |
| 2015/0092973 A1 | 4/2015 | Risberg | |
| 2016/0203811 A1* | 7/2016 | Brockmole | G10H 1/18 381/94.5 |

FOREIGN PATENT DOCUMENTS

| | | | |
|---|---|---|---|
| CN | 101855917 | | 7/2016 |
| JP | 09232896 A | * | 9/1997 |
| TW | 201308198 | | 2/2013 |
| WO | WO 20120177572 | | 12/2012 |

OTHER PUBLICATIONS

International Search Report and Written Opinion for corresponding Application No. PCT/US19/24216 filed Mar. 27, 2019, dated Jun. 21, 2019, 16 pages.

Esqueda, F., et al., 23rd European Signal Processing Conference, "Aliasing reduction in soft-clipping algorithms," EUSIPCO 2015 (Dec. 22, 2015): 2014-2018, 5 pages.

International Search Report and Written Opinion in corresponding international application PCT/US2018/012325 dated Apr. 3, 2018, 22 pages.

* cited by examiner

1200

① DELAY (SAMPLES) : 1 SAMPLE = 1/48KHz(fs) = 0.02ms
1000 SAMPLES = 0.02 X 1000 = 20ms DELAY TIME, 1500 SAMPLES = 0.02 X 1500 = 30ms DELAY TIME

② : IMPACT OF FEEDBACK DELAY COEFF (IMPULSE RESPONSE)

③ REFLECT WAVE AND REVERB

THERE ARE MANY IMPULSE PATTERNS.   ROOM SIZE,
                                    WALL, FLOOR, CEILING (FIGURE AND MATERIAL)

THE DELAY TIME DEPENDS ON DSP DATA MEMORY SIZE.

SYSTEM FOR CONFIGURATION AND STATUS REPORTING OF AUDIO PROCESSING IN TV SETS

CROSS-REFERENCE TO RELATED APPLICATIONS

This application is a continuation-in-part of U.S. patent application Ser. No. 15/862,045 entitled "Configurable Multi-Band Compressor Architecture with Advanced Surround Processing," filed Jan. 4, 2018, which claims priority to U.S. Provisional Patent Application No. 62/442,195 entitled "Three Band Compressor with Advanced Surround Processing," filed Jan. 4, 2017; this application also claims priority to U.S. Provisional Patent Application 62/649,461 entitled "System for Configuration and Status Reporting of Audio Processing in TV Sets," filed Mar. 28, 2018; the entire content of each of which noted applications is incorporated herein by reference.

BACKGROUND

It is common for television (TV) sets to offer remote control over a wide range of parameters which determine details of the presentation to a TV viewer. These include universally common items such as channel selector, volume control, and audio mute, as well as more detailed and set-specific features as control over color, audio program selection, and automatic audio control features such as automatic loudness control, GEQ, surround etc.

It is nearly universal that when the remote volume control is activated to turn volume up or down, or mute the audio, a visual indicator appears on the video display indicating the setting of the volume control or the presence/absence of mute. In the former, this typically takes the form of a linear bar graphic, frequently accompanied by a number indicating the volume setting. Some manufacturers use a circular graphic with a number instead. The latter typically takes the form of a representation of a speaker with or without an "X" superimposed over it.

In all these functions, when the viewer activates the remote control, the visual indicator appears while the remote is activated, and the indicator persists for a short time (usually a few seconds) after the last activity in the remote. These indicators are useful for informing the viewer of the current state of the volume and mute system in the TV.

In many TV sets, however, there are customarily additional features which are accessible solely via a series of remote control activations. For example, the screen brightness is usually accessible by selecting a "menu" button, then using up/down arrows to select "video" from a list of options, pressing the "menu" button again (or an "enter" button), navigating via arrows to "brightness" and then using arrows to select brighter or darker. The setting is often displayed by means of a bar graph and number, as described above for the volume setting. However, these settings usually require the viewer to navigate through a complex menu hierarchy, pressing more than one remote-control button, and sometimes the same button more than once, in order to reach the actual control which changes the brightness. This "deep dive" into the menu system results in these options typically being configured only once or not at all.

Similarly, in modern TV sets, there are customarily additional audio features which are accessible solely via series of remote-control activations. Many modern TV sets feature various sound "modes" such as "theatre," "news," "music," and as well may allow activation of audio features such as automatic loudness compensation, surround sound enhancement, and different frequency equalization options. These modes are accessible only through a similar deep dive into the remote-control menu system, wherein the viewer typically must press many buttons on the remote control, usually beginning with "menu" and leading on to selecting the audio submenu option, accessing the appropriate section of the audio submenu, and turning on/off or selecting the specific desired audio processing option. Often, if the wrong menu path is chosen, the viewer typically must either start over or navigate back up through the menu hierarchy.

It may be possible to add a button to the remote control which would provide a shortcut to the audio sub-menu, thereby avoiding the need to press several buttons in sequence. Remote controls are, however, notorious for being cluttered with many buttons, and there are many options which compete with each other for being controlled by a specific button. As well, additional buttons adds cost to the remote control. One trend in remote control system designs is to minimize the number of buttons presented to the viewer.

It may also be noted that discerning the state of the video display in a TV set is relatively easy within a very short stretch of time observing a TV picture. Low or excessive brightness, poor color settings, and improper contrast are generally obvious upon short inspection. And, furthermore, many viewers find it unnecessary to change the detailed visual settings that are accessible only through a deep dive into the menu system from program to program.

However, many more sophisticated audio settings are generally not as easy to discern within a short period of time. For example, the presence or absence of surround enhancement processing depends on the program material to manifest itself. So, in order for a viewer to determine whether surround enhancement processing is on or not requires either waiting for the right program material, or conducting a time-intensive and multi-step process ("taking a deep dive") into the audio sub-menu system to verify the processor's status. As well, since many of the more sophisticated audio settings would ideally be changed based on the program being viewed, this system requires the viewer to spend time on the deep dive each time the program type is changed.

Requiring such a deep dive can be disadvantageous since it may result in a viewer being unaware of audio processing options available to improve enjoyment of listening, as well as potentially leaving the audio system in a mode that is sub-optimum for the program being viewed.

SUMMARY

Embodiments of the technology described herein relate to adjusting sound characteristics in sound-producing devices and systems having multiple speaker and two or more sound (auditory) channels, including but not limited to television (TV) sets. Embodiments of the present disclosure provide a number of advantages, relative to prior techniques, including the ability, when operating a television (TV) set, to avoid requiring multiple button presses in order to get to the audio sub-menu within a TV set remote control. Embodiments of the present disclosure can make it possible to avoid such multiple button presses without requiring a separate button on the remote control associated with the audio sub-menu. Embodiments of the present disclosure can function to remind viewers of the status of audio options normally controlled by the audio sub-menu. Embodiments of the present disclosure can also function to inform viewers of available audio options which may improve their viewing/listening experience.

One aspect of the present disclosure presents a system including a television (TV) set having included audio system. The TV set permits control over various functions, at least including audio volume, via a remote control. When the viewer activates the remote volume control, a graphic appears indicating the state of the volume control and, optionally the mute status. If a mute button is provided on the remote control, when the viewer activates the mute button, a graphic appears indicating the state of muting and, optionally, the volume control status. The TV set also offers control over various aspects of the audio system, including settings which go beyond adjusting sound volume (volume up/down), generally through some sort of menu system.

In exemplary embodiments, each time a remote volume control is pressed, the graphic which appears includes, in addition to the bar-graph, circular display, numerical readout, or other form of indicating volume level, another graphic that presents to the viewer the state of additional audio controls. In the preferred embodiment, these controls will present the state of all first-level functions in the audio system. In the preferred embodiment, these controls allow selection of these first-level features by simple navigation using up-down or left-right arrows, then selecting menu or enter (or similar "activate" button) to turn them on or off or select the desired feature.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described and/or with the component order changed.

Embodiments of the technology described herein provide a number of advantages, relative to prior techniques, including the ability, when operating a television (TV) set, to avoid requiring multiple button presses in order to get to the audio sub-menu within a TV set remote control. Embodiments of the present disclosure can make it possible to avoid such multiple button presses without requiring a separate button on the remote control associated with the audio sub-menu. Embodiments of the present disclosure can function to remind viewers of the status of audio options normally controlled by the audio sub-menu. Embodiments of the present disclosure can also function to inform viewers of available audio options which may improve their viewing/listening experience.

An aspect of the present disclosure provides a system including a television (TV) set having included audio system. The TV set permits control over various functions, at least including audio volume, via a remote control. When the viewer activates the remote volume control, a graphic appears indicating the state of the volume control and, optionally the mute status. The graphic can be presented on the TV screen. In alternate embodiments, the graphic may be presented on a display of the remote, or even some other location, e.g., a different remote control. If a mute button is provided on the remote control, when the viewer activates the mute button, a graphic appears indicating the state of muting and, optionally, the volume control status. The TV set also offers control over various aspects of the audio system, including settings which go beyond volume up/down, generally through some sort of menu system.

In exemplary embodiments, each time the remote volume control is pressed, the graphic which appears includes, in addition to the bar-graph, circular display, numerical readout, or other form of indicating volume level, another graphic that presents to the viewer the state of additional audio controls. In the preferred embodiment, these controls will present the state of all first-level functions in the audio system. In the preferred embodiment, these controls allow selection of these first-level features by simple navigation using up-down or left-right arrows, then selecting menu or enter (or similar "activate" button) to turn them on or off or select the desired feature.

Figure 1:
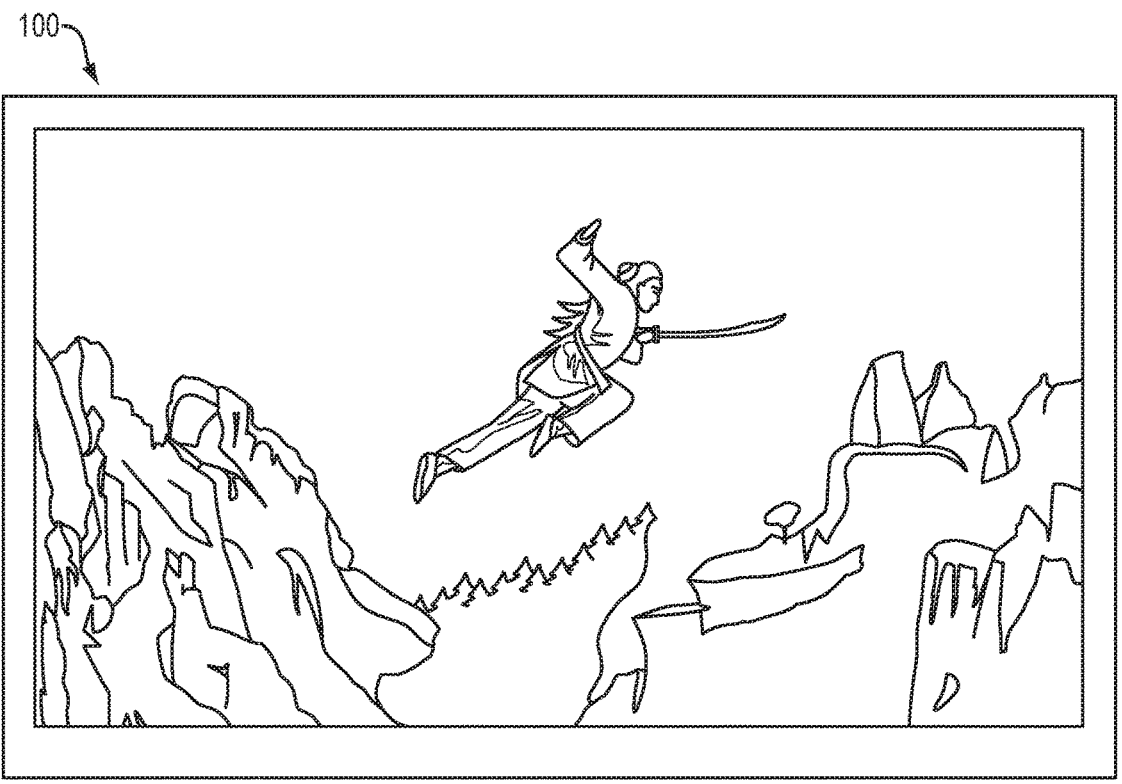
FIG. 1 shows a TV screen for a situation in which a viewer is watching a representative TV program.

FIG. 1 shows a TV screen 100 for a situation in which a viewer is watching a representative TV program.

Figure 2:
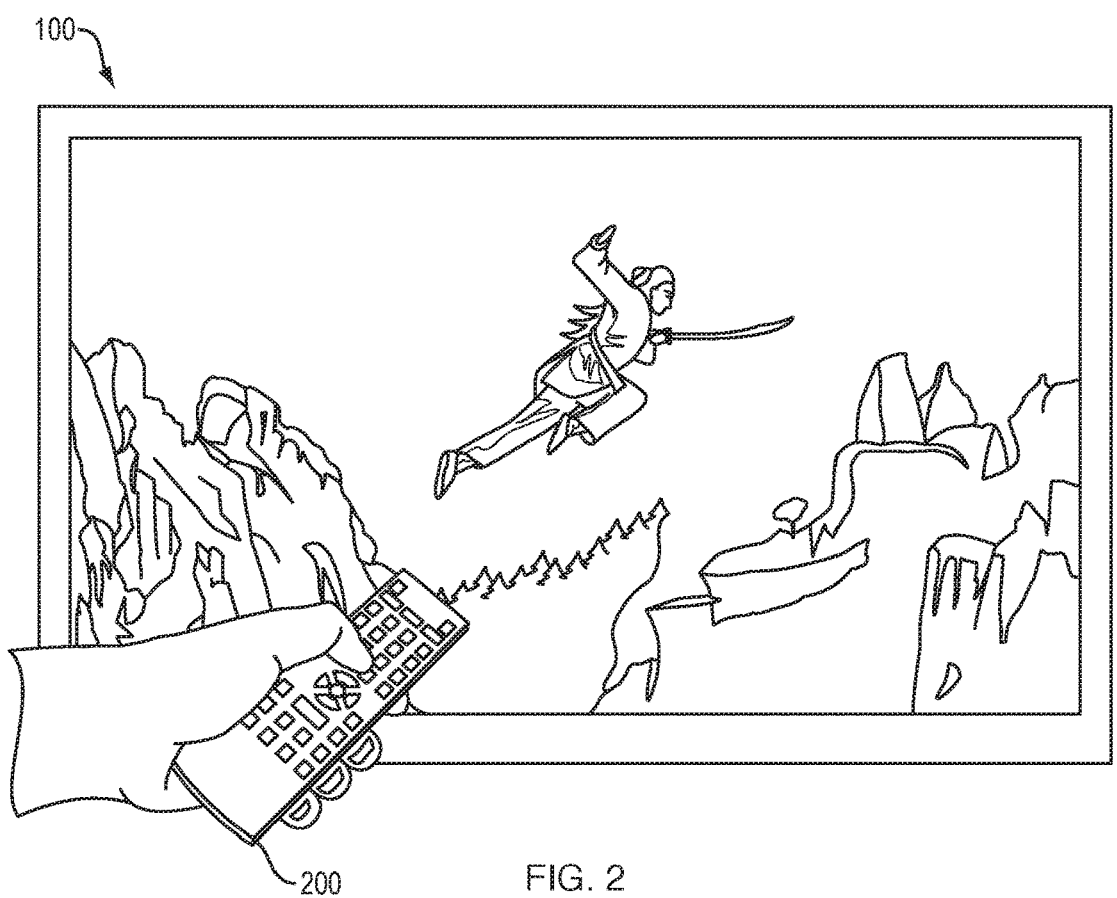
FIG. 2 shows a viewer adjust the TV volume of the TV screen by using a remote control device.

FIG. 2 shows the viewer adjusting the TV volume of the TV screen 100 by using a remote control device 200.

Figure 3:
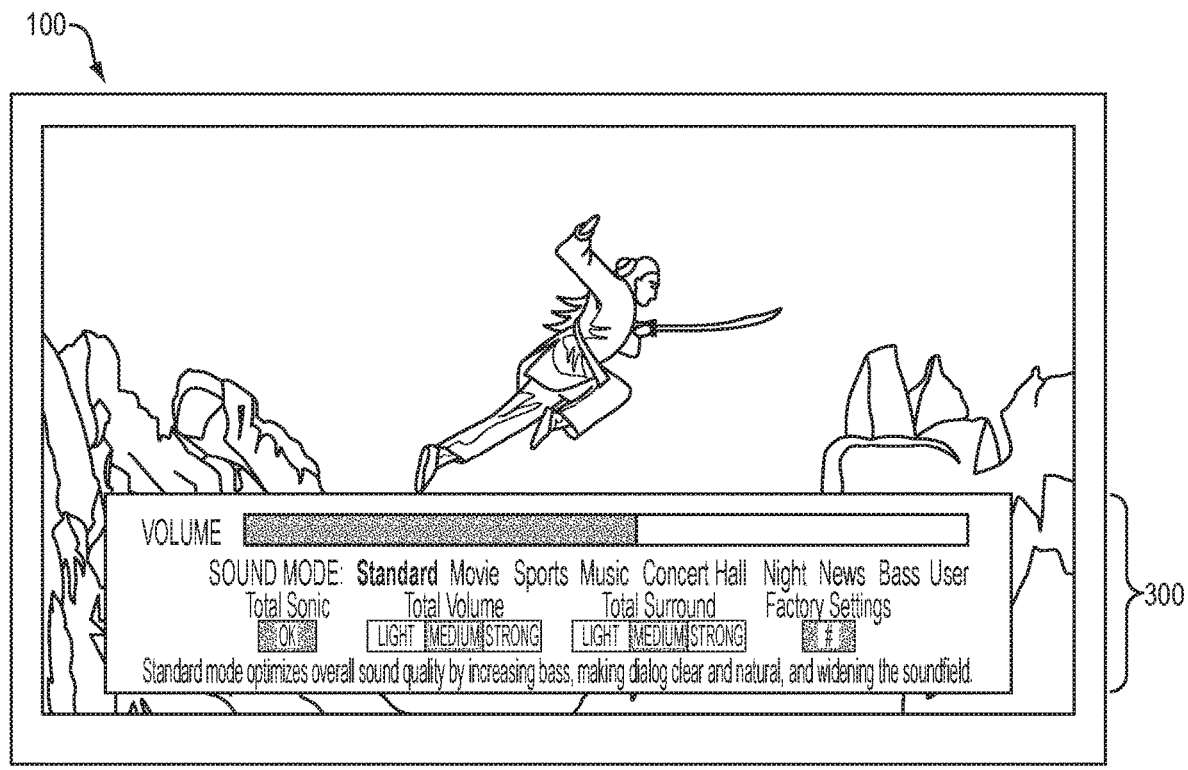
FIG. 3 shows a visual indicator which appears when the volume control is activated, e.g., pressed either up or down. In the case shown, Standard mode is the current TV audio sound mode configuration.

FIG. 3 shows an exemplary visual indicator 300 according to the present disclosure, which preferably appears when a volume control, e.g., on the remote control device, is activated, e.g., pressed either up or down. As shown, the state of the current sound mode (Standard) can be shown along with the state of the various audio effect components that make up the sound mode (e.g., Total Sonics, Total Volume, Total Surround). A brief description of the sound mode may be provided for the user (e.g., viewer) and the user may be presented with the option to change the sound mode. Additionally, the user has the option to return to factory settings. All of this information is available by a single action of the user/view such as by activating, engaging, or selecting a control mechanism or other activation means, e.g., a single selection with a single push of the volume control button or other mechanism. In some embodiment, Standard mode, e.g., may optimize overall sound quality by increasing bass, making dialog clear and natural, and widening the soundfield.

Figure 4A:
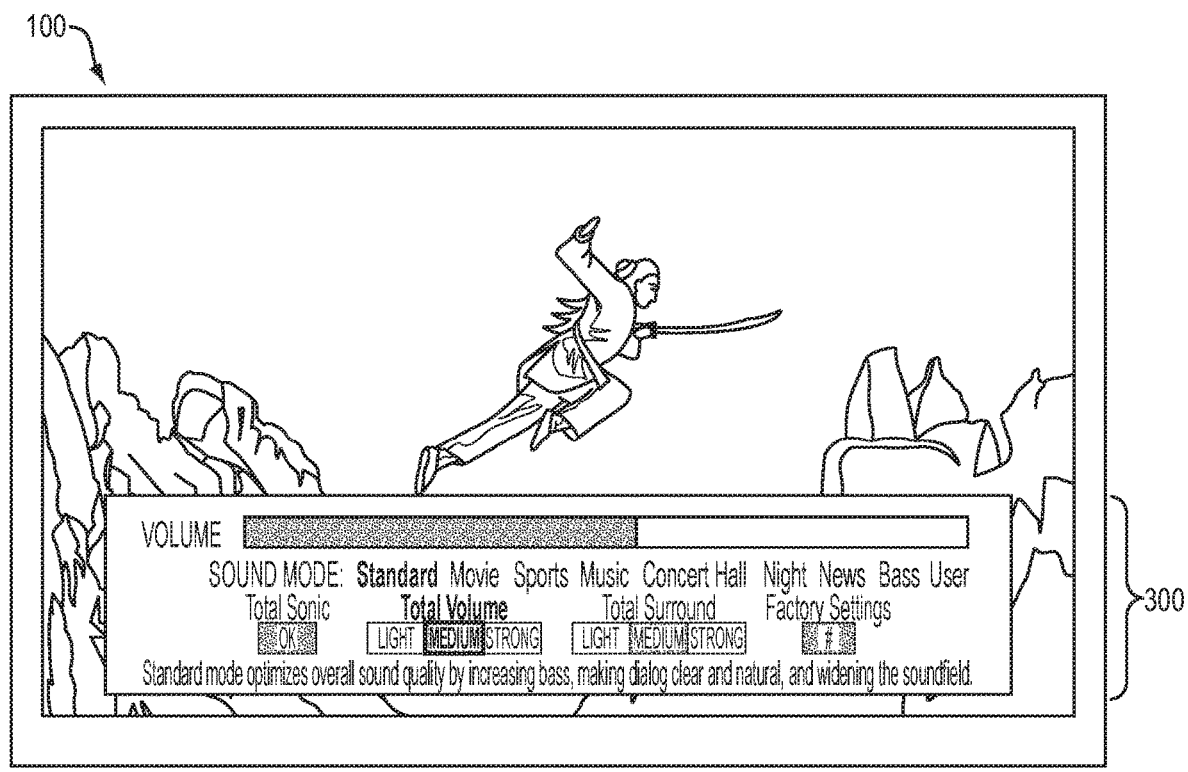
FIGS. 4A-4C show the visual indicator for a situation in which the viewer is changing the setting of the automatic volume control option for Standard mode.
Figure 4B:
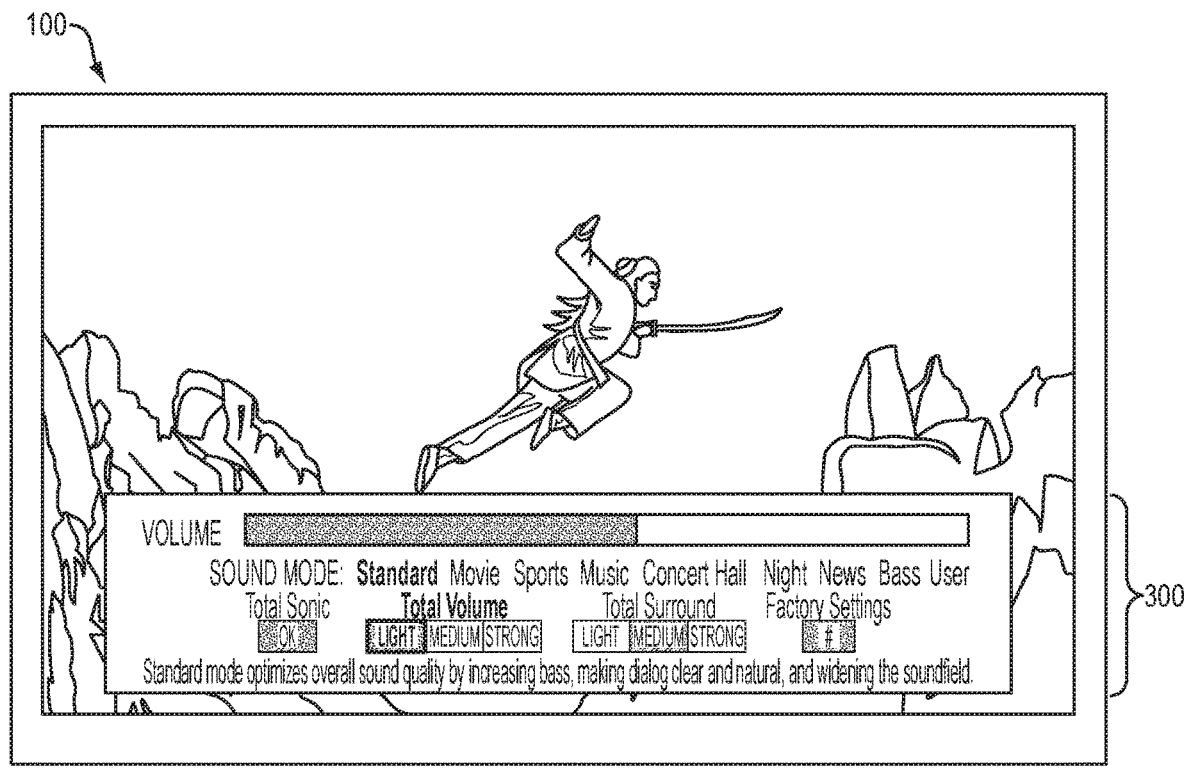
Figure 4C:
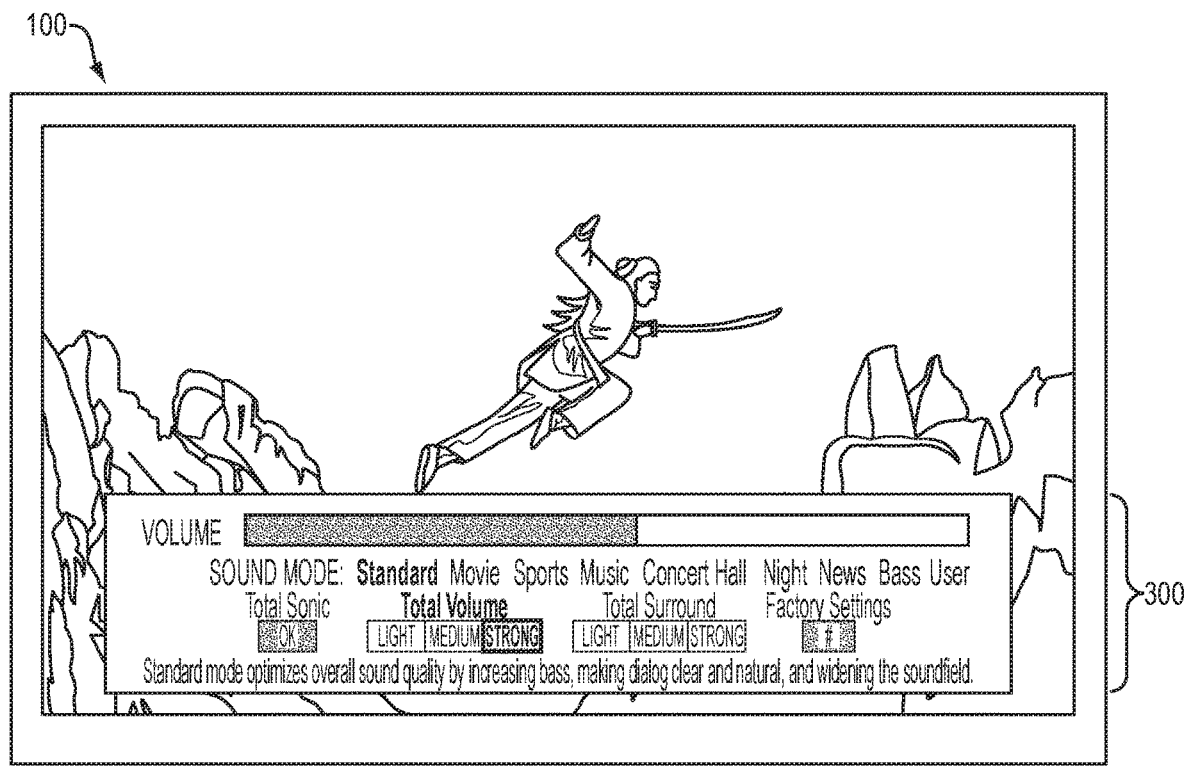

FIGS. 4A-4C show the visual indicator 300 for an exemplary situation in which the viewer is changing the setting of the automatic volume control option for Standard mode. In such a situation the viewer does not change the sound mode but is able to change the characteristics of the sound listening mode. In some embodiments the changes will be saved so that they can be recalled each time the modified sound mode is selected.

Figure 5A:
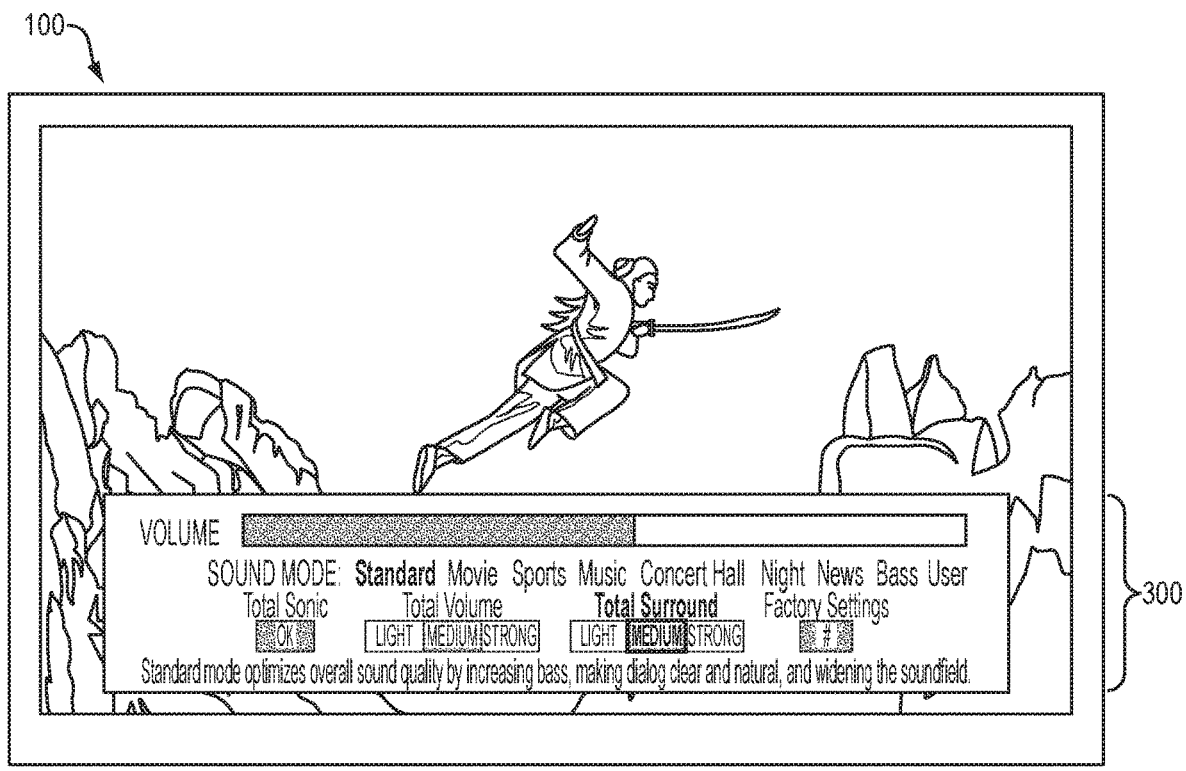
FIGS. 5A-5C show the visual indicator for a situation in which the viewer is changing the setting of the pseudo-surround audio effect for Standard mode.
Figure 5B:
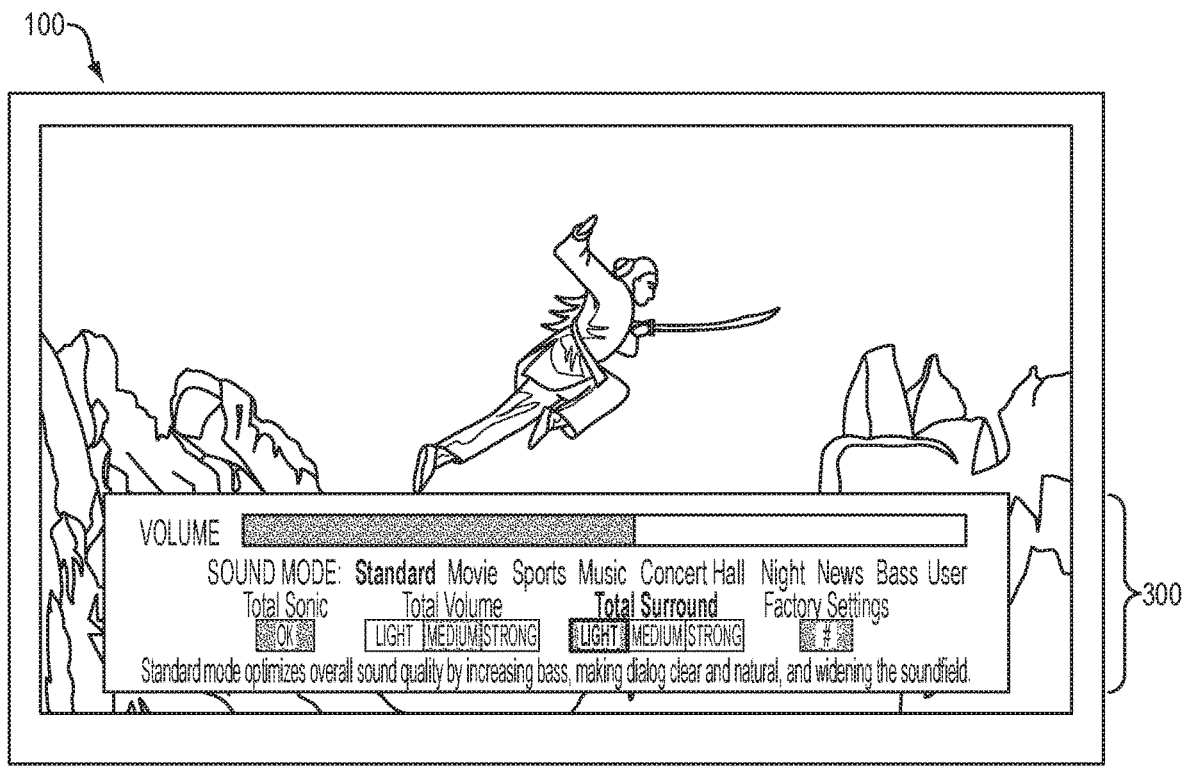
Figure 5C:
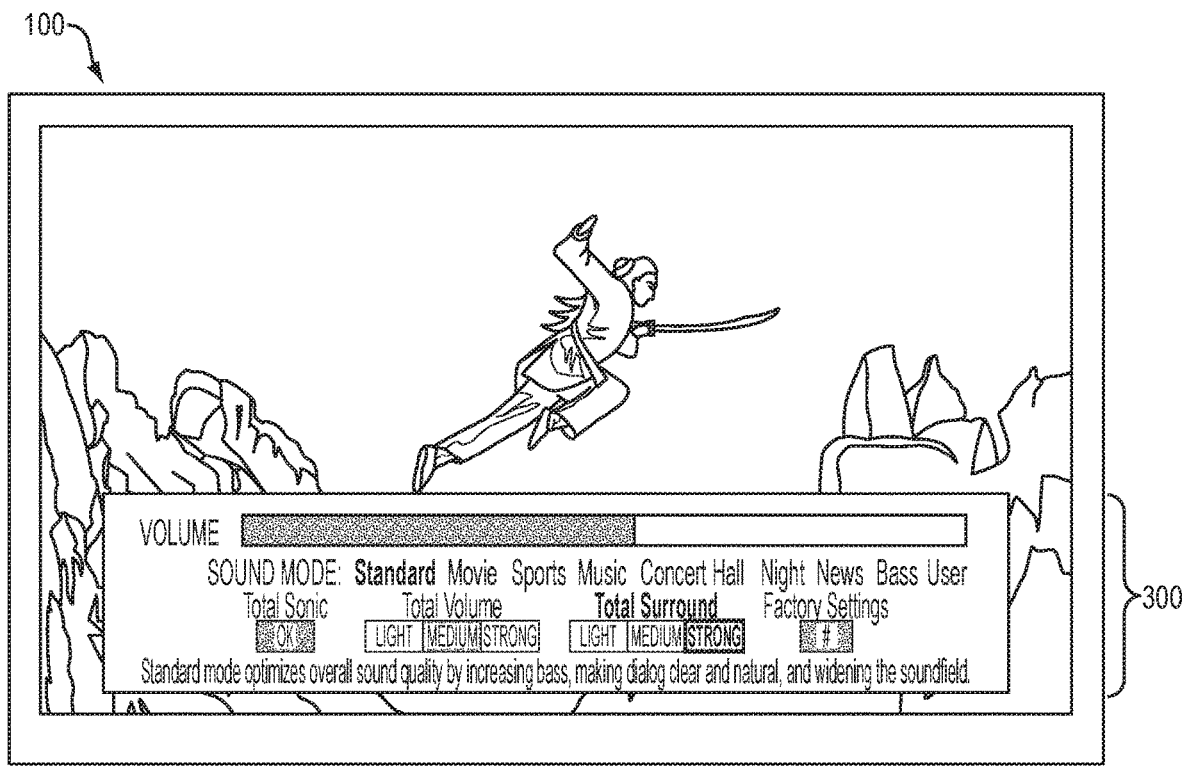

FIGS. 5A-5C show the visual indicator 300 for an exemplary situation in which the viewer is changing the setting of the pseudo-surround audio effect for Standard mode. In these cases the viewer does not change the sound mode but is able to change the characteristics of the sound listening mode. In some embodiments the changes will be saved so that they can be recalled each time the modified sound mode is selected.

Figure 6A:
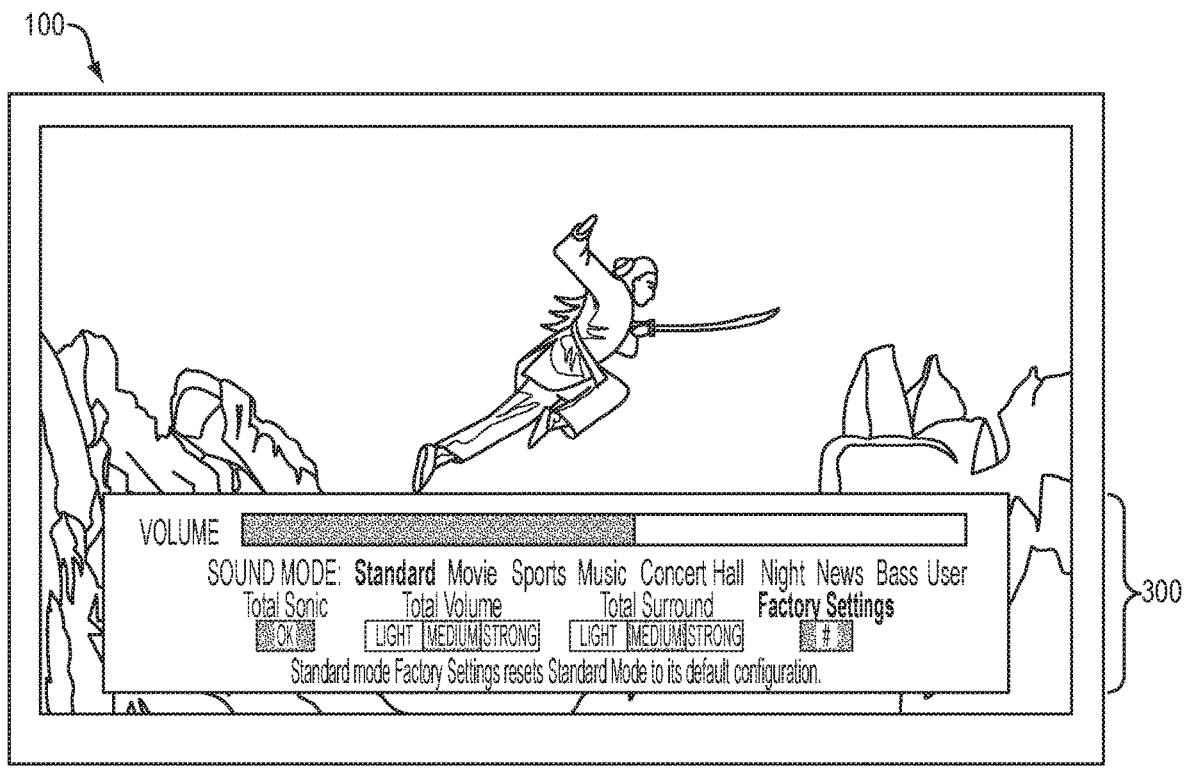
FIGS. 6A-6B show the display for a situation in which the viewer restoring factory settings.
Figure 6B:
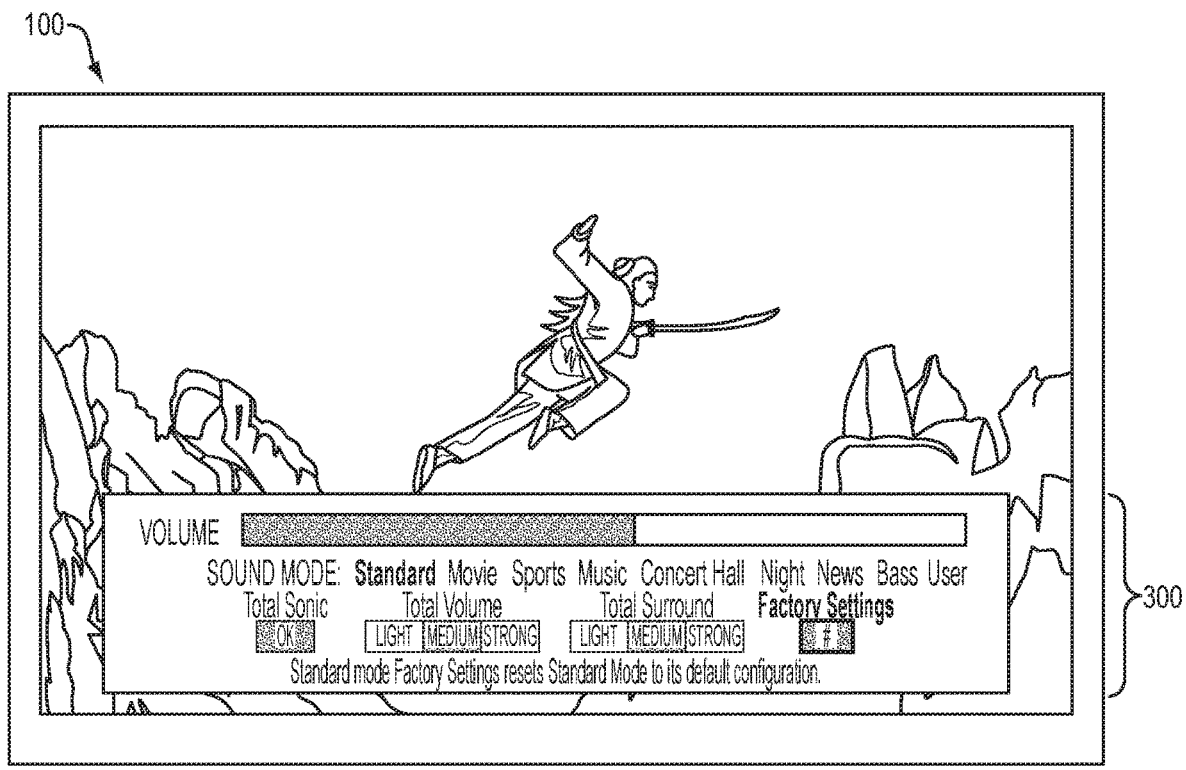

FIGS. 6A-6B show the display 300 for an exemplary situation in which the viewer is restoring original or "factory" settings, such as when the user decides to "undo" previous changes he or she has made and restore factory settings.

FIGS. 7A-7H show the visual indicator 300 for exemplary situations in which the viewer adjusts volume and the TV is configured in a sound mode other than Standard; the figures also show means to change the sound mode, e.g., by highlighting the desired mode and pressing enter.

Figure 7A:
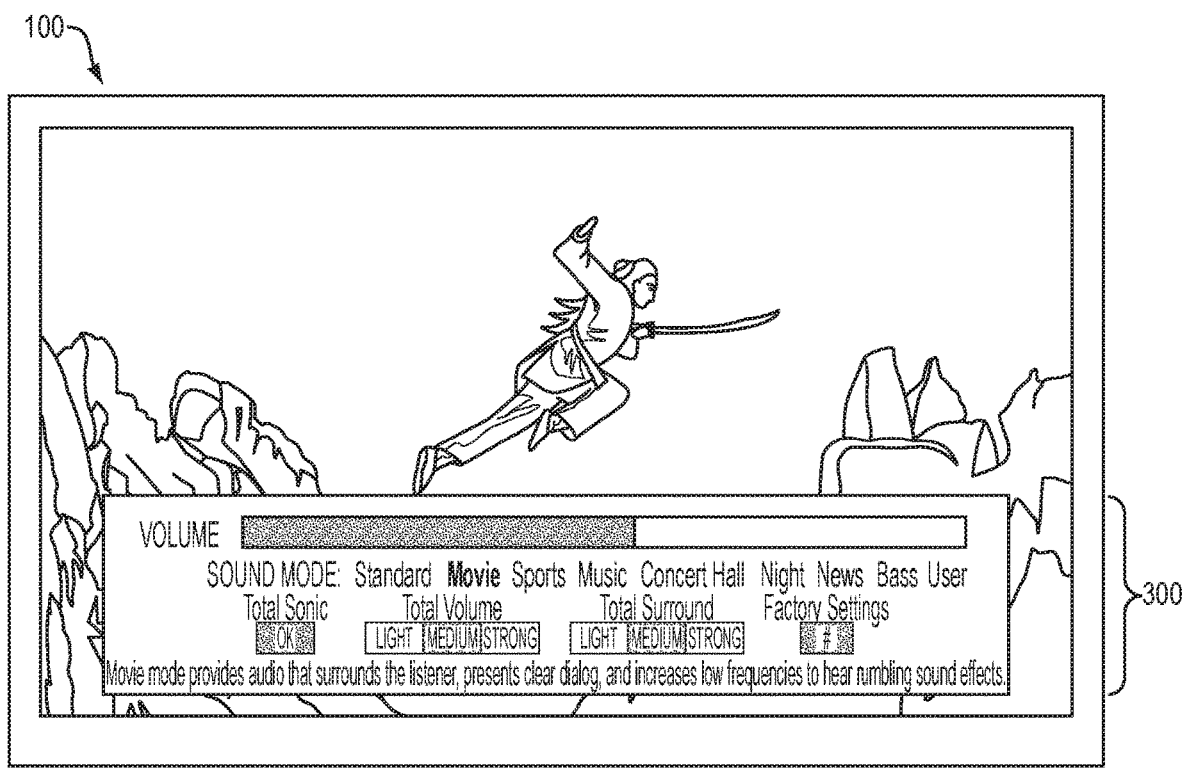
FIGS. 7A-7H show the visual indicator for situations in which the TV is configured in a sound mode other than Standard.

FIG. 7A depicts a Movie mode selection. Movie mode provides a surround experience that wraps around the listener, preserves clear dialog, and increases low frequency response to hear rumbling sound effects. It utilizes the L–R delay loop and width adjustment of or provided by advanced surround to add a dimension of depth to the soundfield.

Figure 7B:
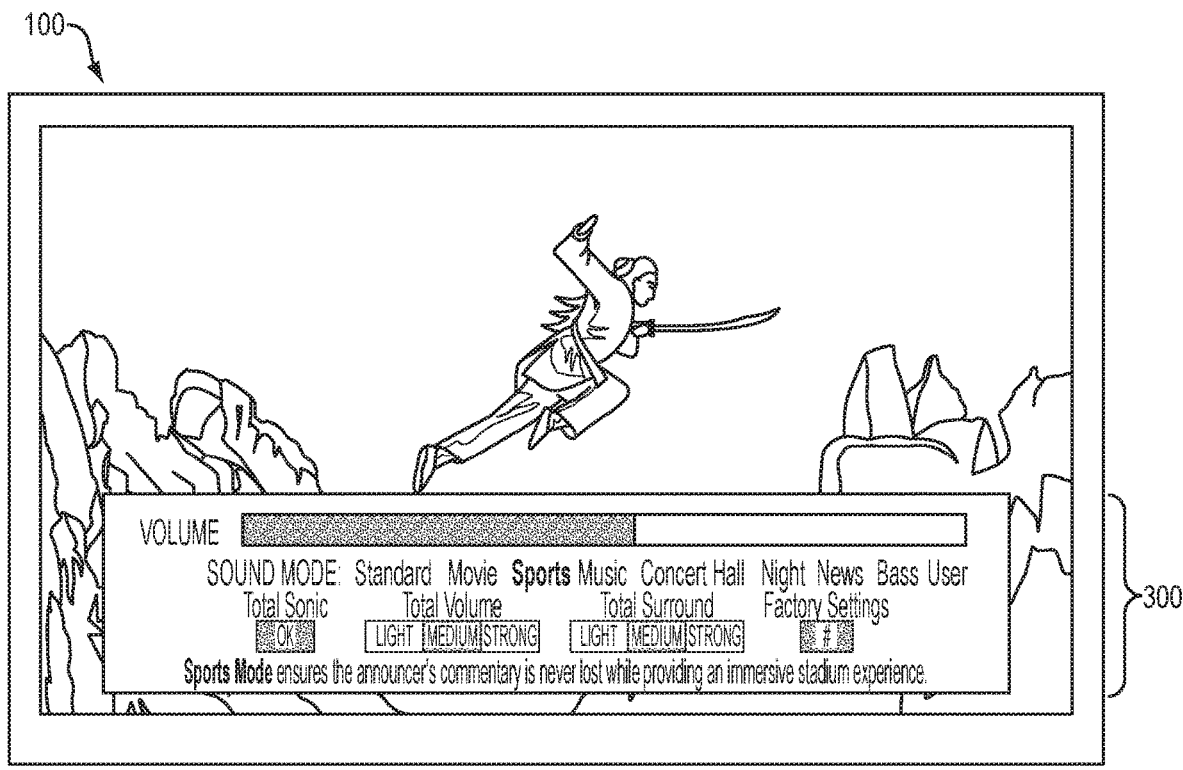

FIG. 7B depicts a Sports mode selection. Sports mode gives the announcer's voice a prominent place in the mix while generating a lifelike stadium atmosphere and crowd sound. It ensures the right balance between dialog and crowd/action noise.

Figure 7C:
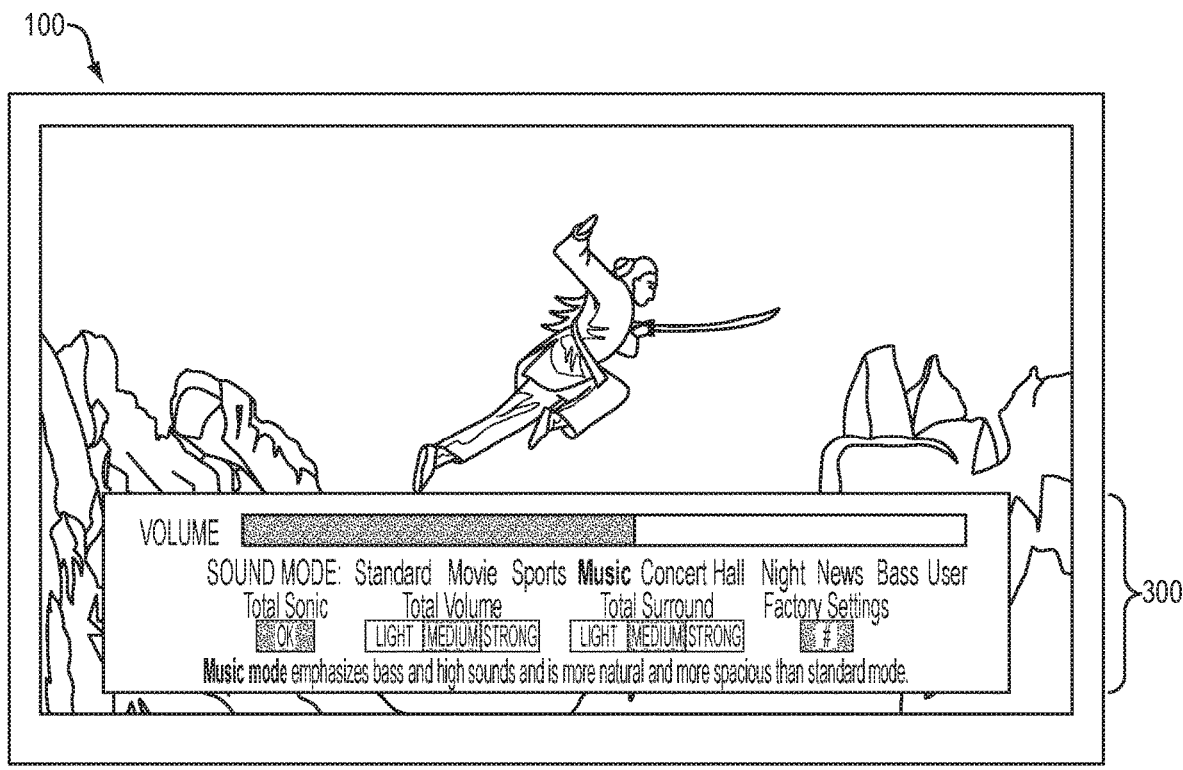

FIG. 7C depicts a Music mode selection. Music mode emphasizes bass and high-frequency sounds, and is more natural and "spacious".

Figure 7D:
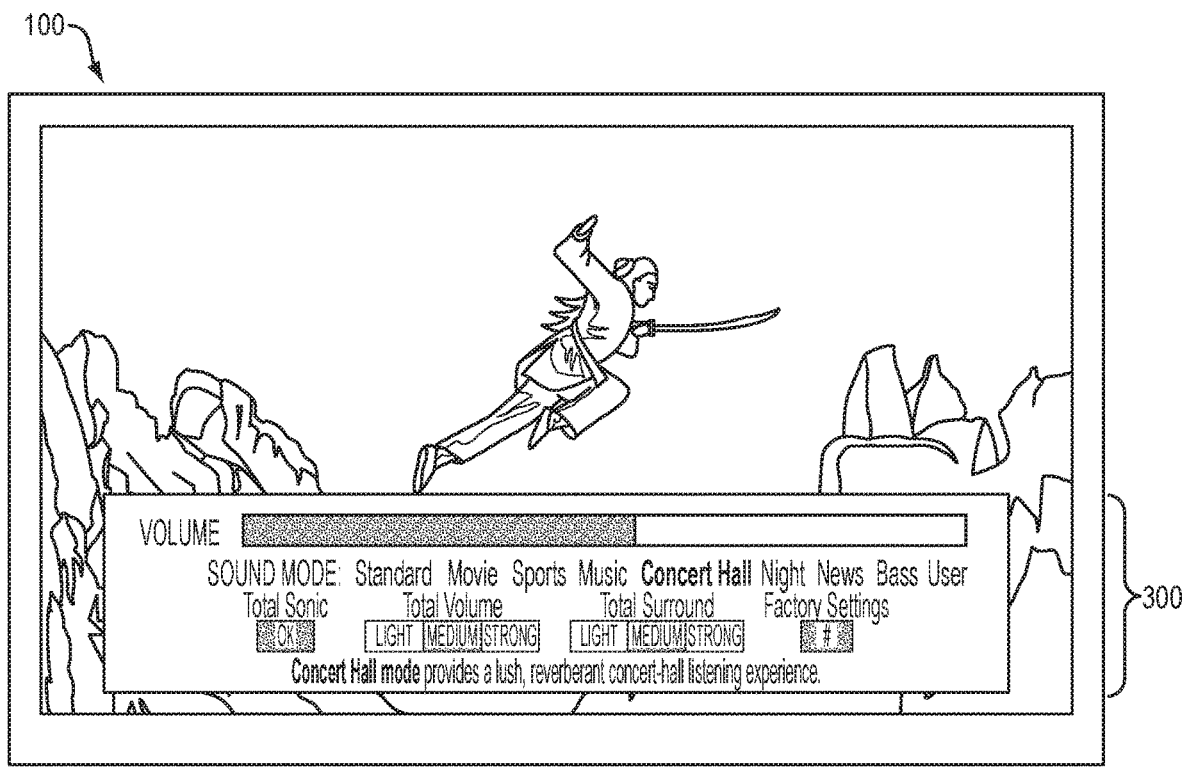

FIG. 7D depicts a Concert Hall mode selection. Concert Hall mode simulates concert hall acoustics using advanced surround technology.

Figure 7E:
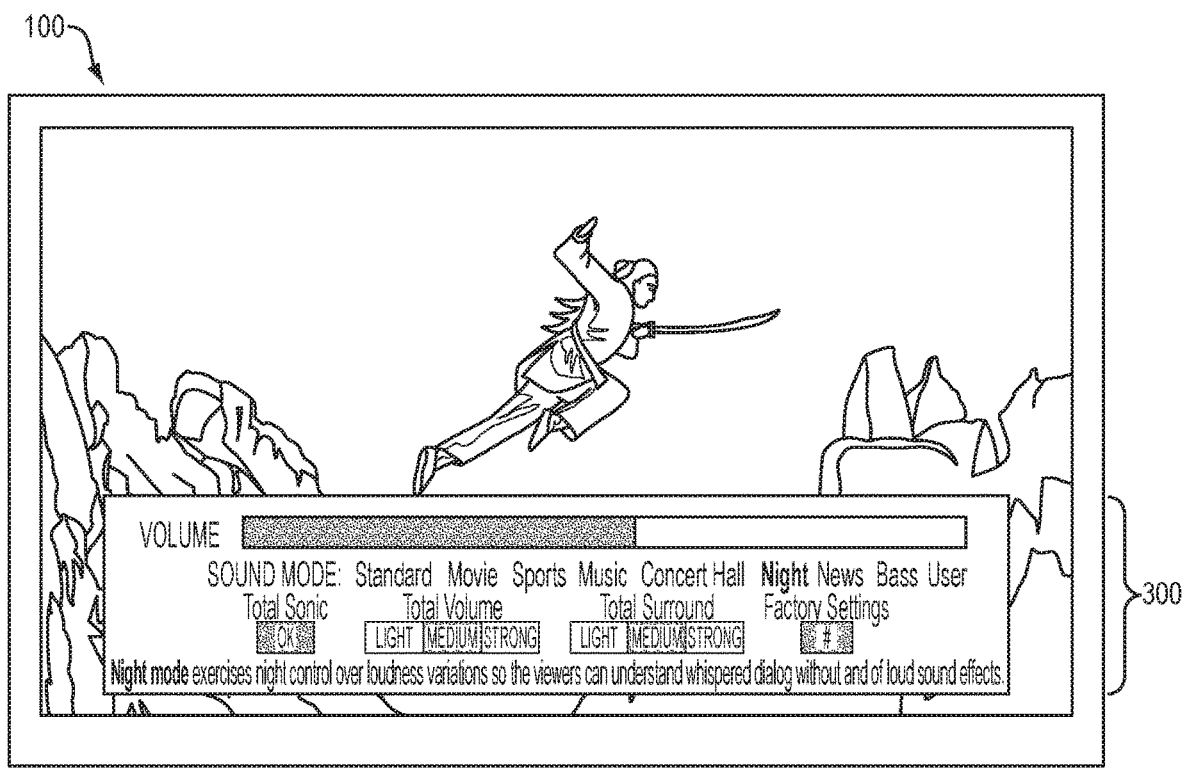

FIG. 7E depicts a Night mode selection. Night mode exercises tight control over loudness variation so the viewer/user can understand or discern whispering dialog without worry of loud sound effects.

Figure 7F:
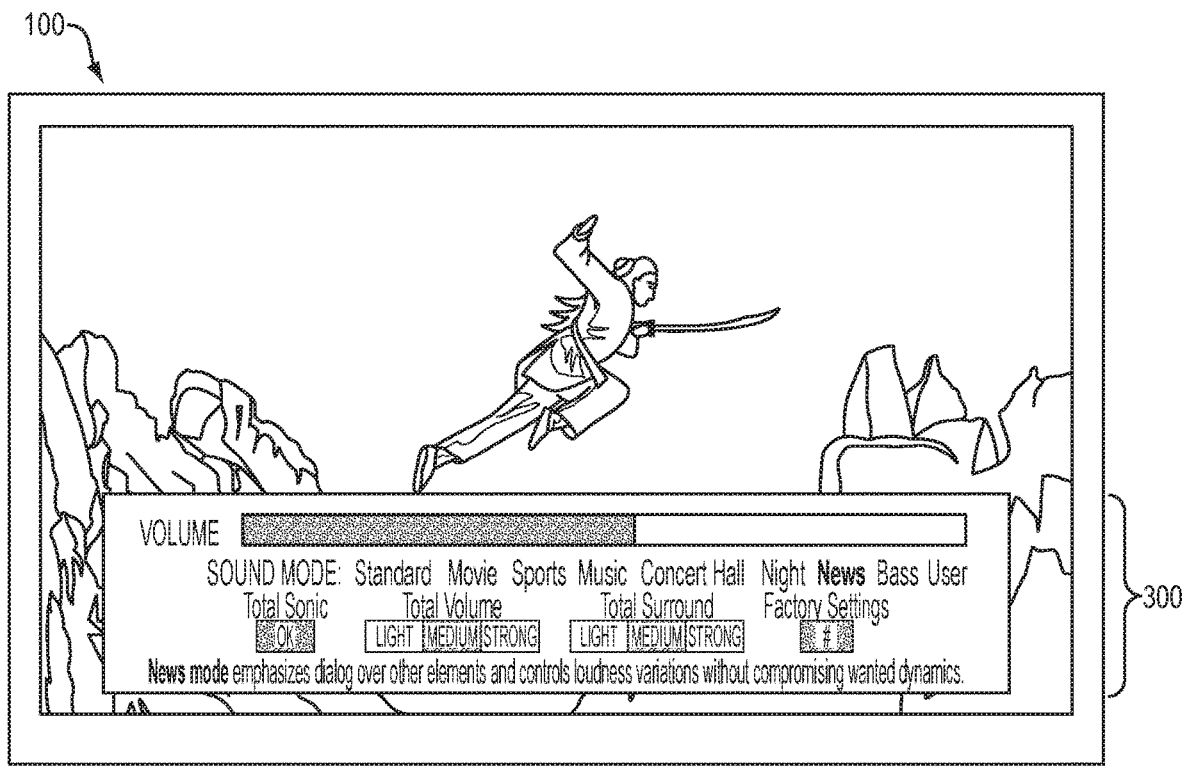

FIG. 7F depicts a News mode selection. News mode emphasizes dialog over other sound elements and controls loudness variation without compromising wanted dynamics.

Figure 7G:
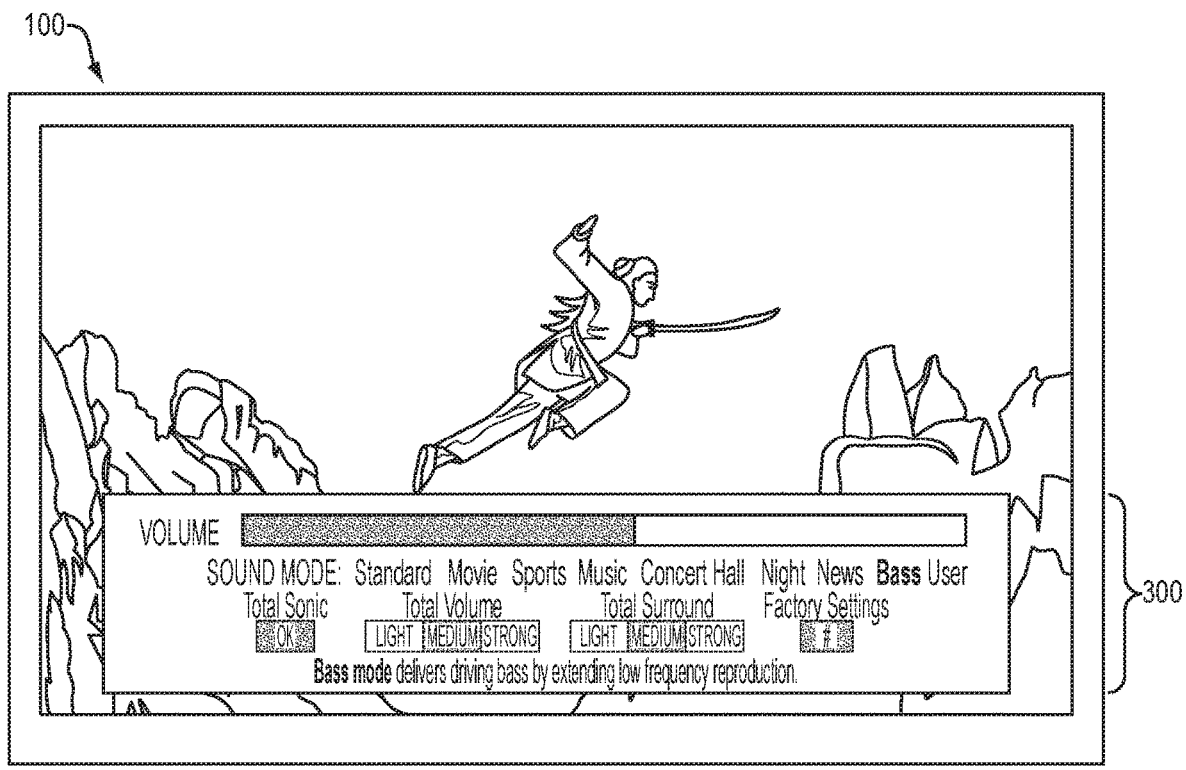

FIG. 7G depicts a Bass mode selection. Bass mode maximizes low-frequency output

Figure 7H:
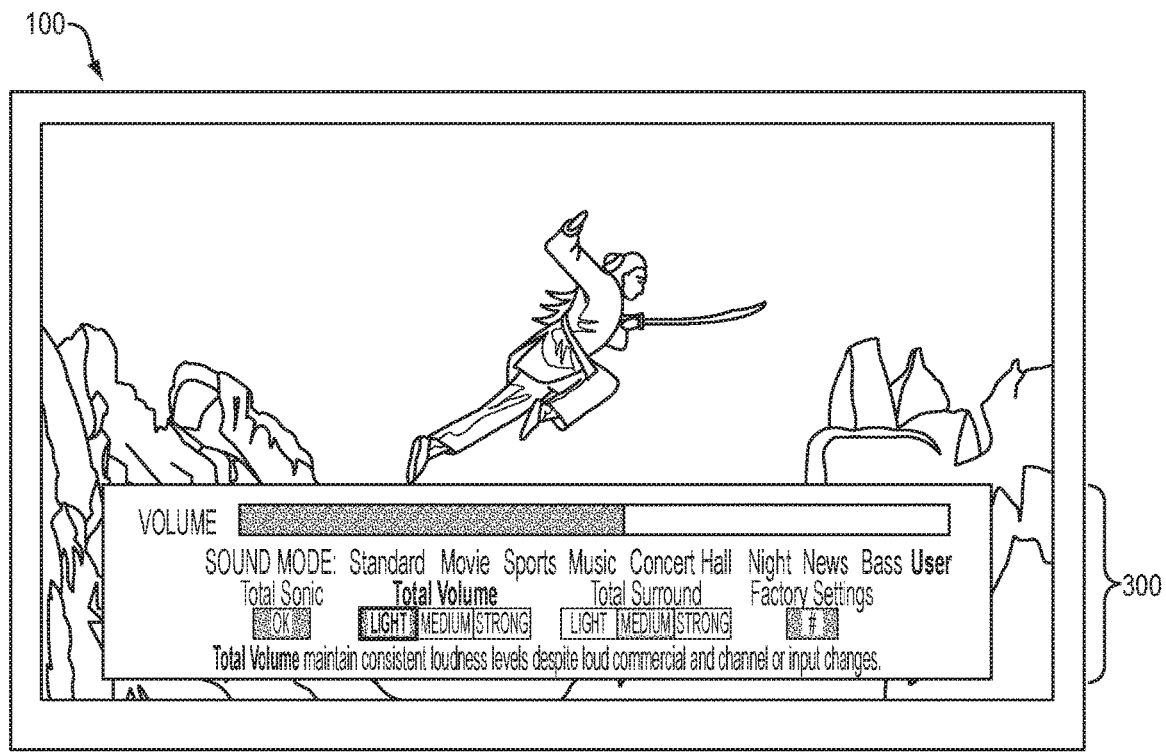

FIG. 7H depicts a User mode selection. In exemplary embodiments, User mode allows the viewer to customize the television's audio settings for preferred sound characteristics.

Exemplary Embodiments utilizing certain preferred TV set sound processing systems or architectures are described below and in relation to FIGS. 8-14; these are provided merely for example, and other systems, architectures, and embodiments can be realized and practiced within the scope of the present disclosure.

Figure 8:
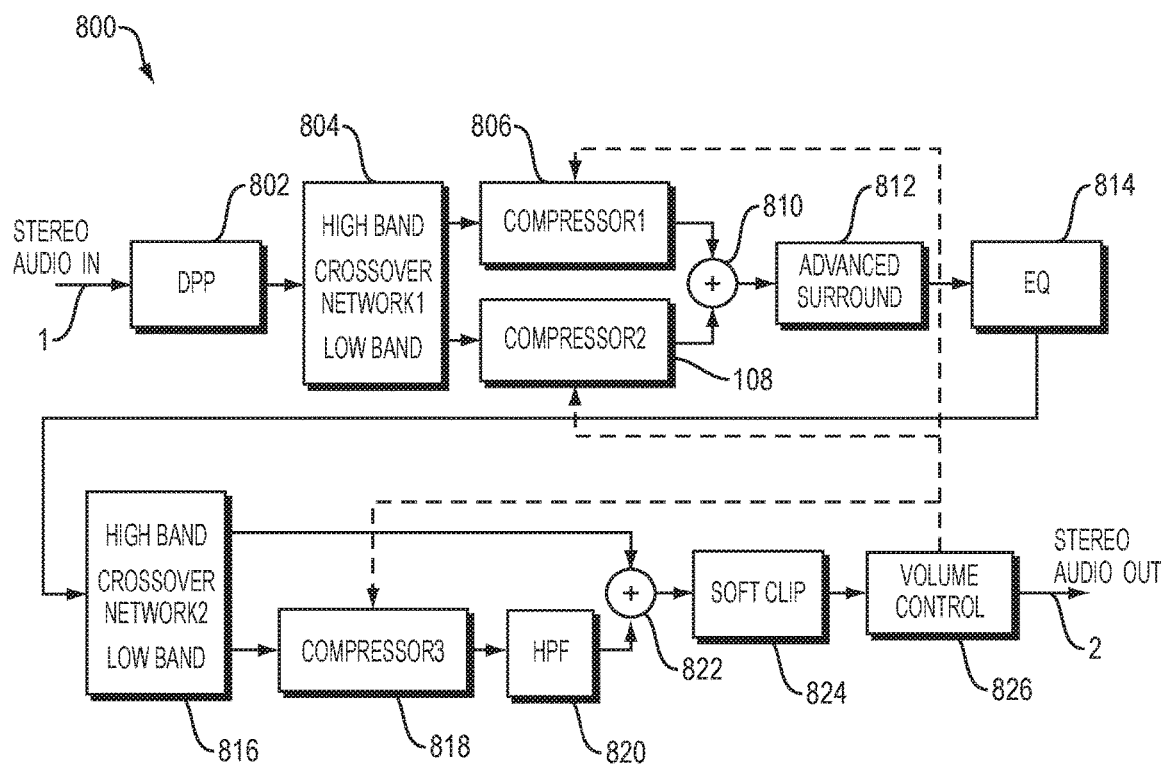
FIG. 8 is a box diagram showing components of an audio signal processing architecture and processing sequence according to an exemplary embodiment of the present disclosure.

FIG. 8 is a box diagram showing components of an audio signal processing architecture 800 and processing sequence according to an exemplary embodiment of the present disclosure. Architecture 800 includes a dual processing protection (DPP) block 802, a first cross over network (indicated as Crossover Network1) 804, first and second compressors (indicated as Compressor1 and Compressor2) 806 and 808, a first summing unit 810, an Advanced Surround block 812, and an EQ 814. As shown, architecture 800 also includes a second crossover network (indicated as Crossover Network2) 816, a third compressor (Compressor3) 818, a high-pass filter (HPF) 820, second summing unit 822, Soft Clip unit 824, and volume control unit 826. Representative input 1 and output 2 of the architecture 800 are also indicated. It should be noted that while a single channel is shown for simplicity, e.g., by blocks 804, 806, 808, 810, 816, 818, 820, 822 and 824, all connections between blocks should be regarded as stereo, with both Right and Left stereo channels. Blocks 802, 812, 814 and 826 are stereo input/output blocks inclusive. When the volume control is positioned as shown in FIG. 8, the volume control setting can be configured to feedback to the compressors (as shown by dashed line). Exemplary configurable parameters for each component are described below (of course others are within the scope of the present disclosure): (1) DPP: (L−R/L+R) Ratio Threshold and Center Gain; (2) Crossover network1: Crossover Frequency, Crossover Order; (3) Compressor1: Target Level, Noise Gate, Attack Threshold, Release Threshold, Maximum Compressor Gain, Above Threshold Compression Ratio and Below Threshold Compression Ratio; (4) Compressor2: Target Level, Noise Gate, Attack Threshold, Release Threshold, Maximum Compressor Gain, Above Threshold Compression Ratio, Below Threshold Compression Ratio and Coupling (with Compressor 1) adjustment; (5) Advanced Surround: Width, Sum Feedback Delay, Sum Feedback Delay Coefficient, Sum Delay Gain, Difference Feedback Delay, Difference Feedback Delay Coefficient, Difference Delay Gain, Diff Channel EQ Parameters; and (6) EQ: Center Frequency, Q and Gain for each of seven EQ filters; (7) one or more additional compressors may also be included in certain embodiments and can be adjusted similar to as described above for Compressor1 and/or Compressor$_2$.

In exemplary embodiments, DPP 802, Crossover Network 1 804, Compressor1 806 and Compressor2 808 can be configured as parts of a dynamic volume control (DVC) system (or, architecture); such a DVC system can also include the EQ 814, Crossover Network2 816, Compressor3 818, and HPF 820 configured for compressor-based bass enhancement. Examples of suitable EQs used with a crossover network and a compressor for dynamic volume control include, but are not limited to, those disclosed in co-owned U.S. Pat. No. 9,380,385 filed 14 Mar. 2014 and entitled "Compressor Based Dynamic Bass Enhancement with EQ," the entire content of which is incorporated herein by reference. Examples of suitable DPPs used with crossover networks and compressors for dynamic volume control include, but are not limited to, those disclosed in co-owned U.S. Pat. No. 8,315,411 filed 16 Nov. 2009 and entitled "Dynamic Volume Control and Multi-Spatial Processing Protection," the entire content of which is incorporated herein by reference. Another configuration, described in the present disclosure, uses Advanced to Surround for a concert hall effect. While still another configuration utilizes the DPP Target Sum/Difference ratio, DPP center gain and Advanced Surround to create a sports listening mode effect. And, still another configuration uses Compressor2 and Compressor3 together to create an improved bass enhancement effect.

Figure 9:
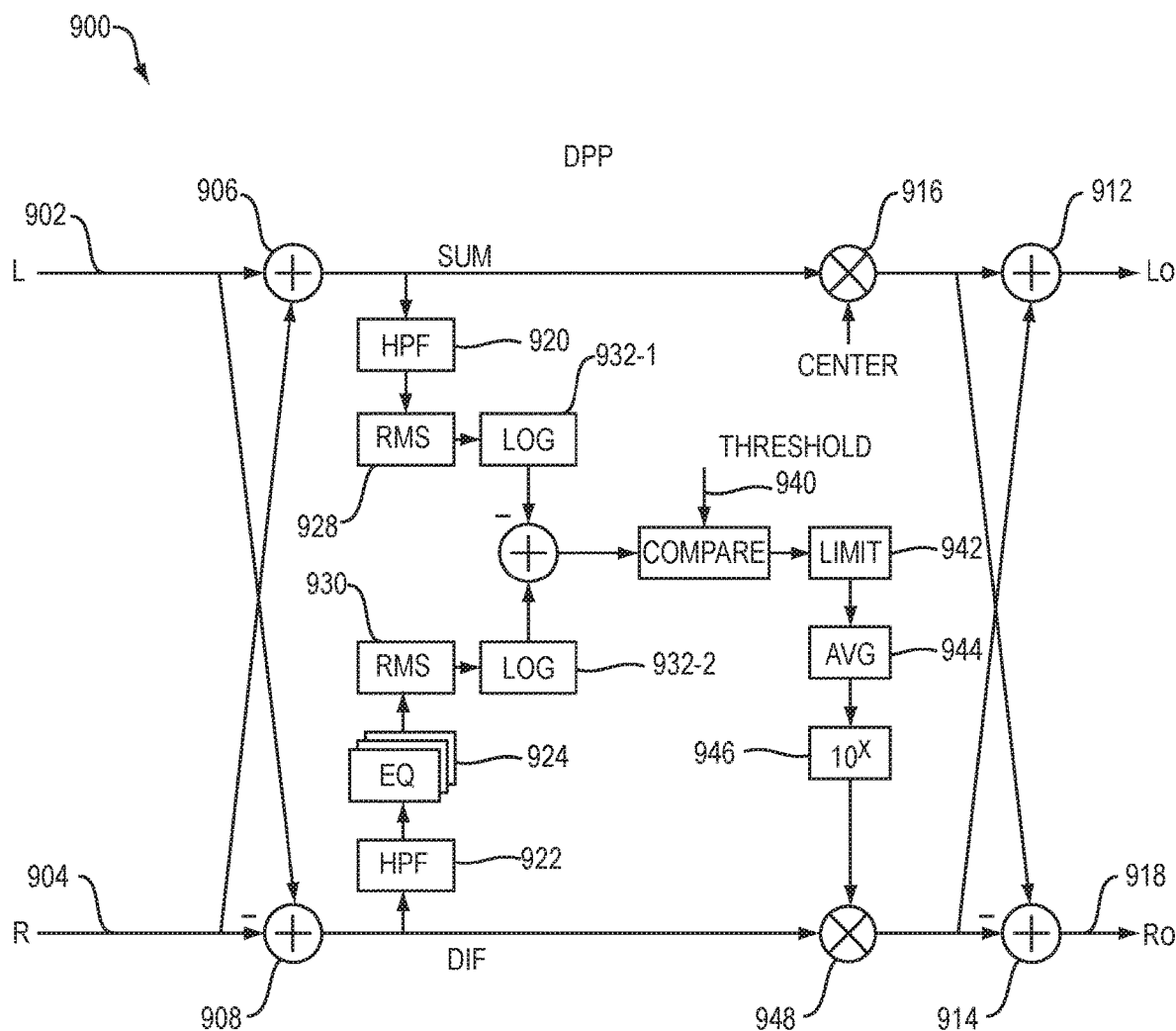
FIG. 9 depicts a block diagram of an exemplary embodiment of a dual processing protection (DPP) architecture in accordance with the present disclosure.

FIG. 9 depicts a block diagram of an exemplary embodiment of a dual processing protection (DPP) architecture 900 in accordance with the present disclosure. Dual processing protection (DPP) is one form or embodiment of a more general Multi-Spatial Processing Protection (MPP), which can refer to the processing of two or more sound channels (e.g., L and R channels). Television manufacturers often include virtual surround (pseudosurround) technology (e.g., SRS Tru-Surround, Spatializer, etc., or the like) in the two-channel television audio output path. This two-channel television audio may go to speakers external to the television or to speakers mounted in the television enclosure. These virtual-surround technologies create the illusion of surround sound by manipulating and enhancing the difference channel (L−R) present in stereo broadcasts. The listener still perceives an intact center image (L+R) but also often hears the difference channel (L−R) either widened over a broad soundstage or as a point source located somewhere other than the speaker locations. Often this type of spatial enhancement is done during the production of the audio programming. This is especially true of television commercials which are enhanced to grab the listener's attention.

When an audio program has two cascaded stages of spatial enhancement (for example at the point of production and in a television's audio processing) there can be significant degradation in the audio quality. The preprocessed audio tends to have significant L−R energy relative to L+R energy. The second, cascaded stage, of spatial enhancement processing tends to increase the amount of L−R energy even more. Recent studies have shown that excessive enhancement of L−R energy is one of the top factors in listener fatigue. There also can be a significant volume increase. Accordingly, in accordance with one aspect of the present disclosure, a MPP system is provided. In exemplary embodiments, the MPP is a double processing protection (DPP) system that is a part of a television audio signal reception and playback system, prior to the television's stereo enhancement technology. The MPP system may be referred to as a pseudosurround signal processor. An exemplary DPP system processes the audio signals so as to minimize the difference (L−R) enhancement (minimizing or reducing the energy level of the difference (L−R) signal relative to the sum (L+R) signal) introduced at the point of production. This allows the television's spatial enhancement technology to process the audio signals in a manner that is psychoacoustically pleasing to the listener. The cascade of the DPP system before the television's spatial enhancement audio processing can be quite effective in mitigating the harsh effects of double spatial processing. In some embodiments, the DPP system can be entirely digital, and/or can be implemented economically in software (e.g., C, C#, assembly language, etc.) and/or digital hardware (e.g., HDL description), etc. It should be appreciated that the DPP system can also be all analog, or a hybrid of analog and digital components.

The DPP 900 functions to limit the difference to sum ratio (L−R)/(L+R) based upon the Threshold setting. It should be noted that by adjusting the Center gain, the sound field collapses proportionally into the center image, while boosting the sum channel, drawing the listener's attention to the center image which is typically the program dialogue. A detailed description of this function is provided in co-owned U.S. Pat. No. 8,315,411 filed 16 Nov. 2009 and entitled "Dynamic Volume Control and Multi-Spatial Processing Protection," the entire content of which is incorporated herein by reference.

Referring to the DPP system 900 shown in FIG. 9, a left signal (L) and right signal (R) are respectively applied to the inputs 902 and 904 of system 900. The L and R signals are applied to matrices represented by the two signal summers 906 and 908. Signal summers 906 and 908 constitute the matrix which provides the SUM (L+R) and DIF (L−R) signals. In the sum (L+R) path, the signal is generally untouched. The SUM signal usually contains audio content which does not necessarily need to be localized. However, in alternate embodiments, frequency contour shaping can be performed to enhance audio content such as dialogue. As shown, the SUM signal is multiplied by a Center constant at signal multiplier 910 prior to be provided to matrices illustrated as signal summers 912 and 914. The Center constant allows the level of the center image (L+R) to be adjusted, if desired, to aid in intelligibility of dialogue. Adding the L+R and L−R signals provides the left output signal Lo at output 916, while subtracting the L−R from the L+R provides the right output signal Ro at output 918.

In the illustrated embodiment of FIG. 9, most of the processing occurs in the DIF (L−R) path. L+R and L−R are compared to determine the level of the L−R signal relative to L+R. Before comparison, these two SUM and DIF signals can be each passed through a respective high pass filter 920 and 922, such as in circumstances where the speaker frequency response does not include low frequencies. The L−R DIF signal can further be passed through a multi-band equalizer 924 to accentuate the frequencies the human ear is most sensitive to, namely mid-range frequencies, to compensate for the perceived loudness level of the L−R signal. Equalizer 924 allows the difference channel level detection to be frequency dependent. For example, low frequency signals may be minimized when processing for inexpensive television speakers with limited bass response. High frequencies may be minimized to limit the response to transient audio events. Typically mid-range frequencies, where the ear is most sensitive, are equalized to dominate the difference level detection. Once the levels of the difference and sum signals are calculated the DIF/SUM ratio is determined.

Each of these signals is then run through a respective signal level detector 928 and 930. The detectors listed above can be used, such as an RMS level detector, although any type of level detector (such as the ones described above) can be used. Also, the processing can all be performed in the log domain to increase efficiency by processing them through the log domain processing blocks 932-1 and 932-2.

The outputs of the blocks 932-1 and 932-2 are applied to the signal summer wherein the processed SUM signal is subtracted from the processed DIF signal. Subtracting one signal from the other in the log domain is the same as providing a signal that is the ratio of the process SUM signal to that of the DIF signal in the linear domain. Once the L+R and L−R signal levels are calculated, where the L−R signal level may have been equalized prior to level detection to increase the mid-range frequencies, these two signal levels are compared by the comparator 938 to a preset threshold 940. The ratio between the two signals ((L−R)/(L+R)) is compared to a threshold ratio by comparator 938 in order to determine the recommended L−R signal gain adjustment. A limiter stage 942 may be used to limit the amount and direction of gain applied to the L−R signal. The illustrated embodiment limits the gain at 0 dB hence only allowing attenuation of the L−R signal, although in some applications, there may be a desire to amplify the L−R signal. An averaging stage 944 averages, with a relatively long time constant, the output of the limiter stage 942 so as to prevent the DPP system from tracking brief transient audio events. After conversion back to the linear domain by linear domain block 946, the level of the L−R signal is correspondingly adjusted by the signal multiplier 948 to achieve that target ratio.

Figure 10:
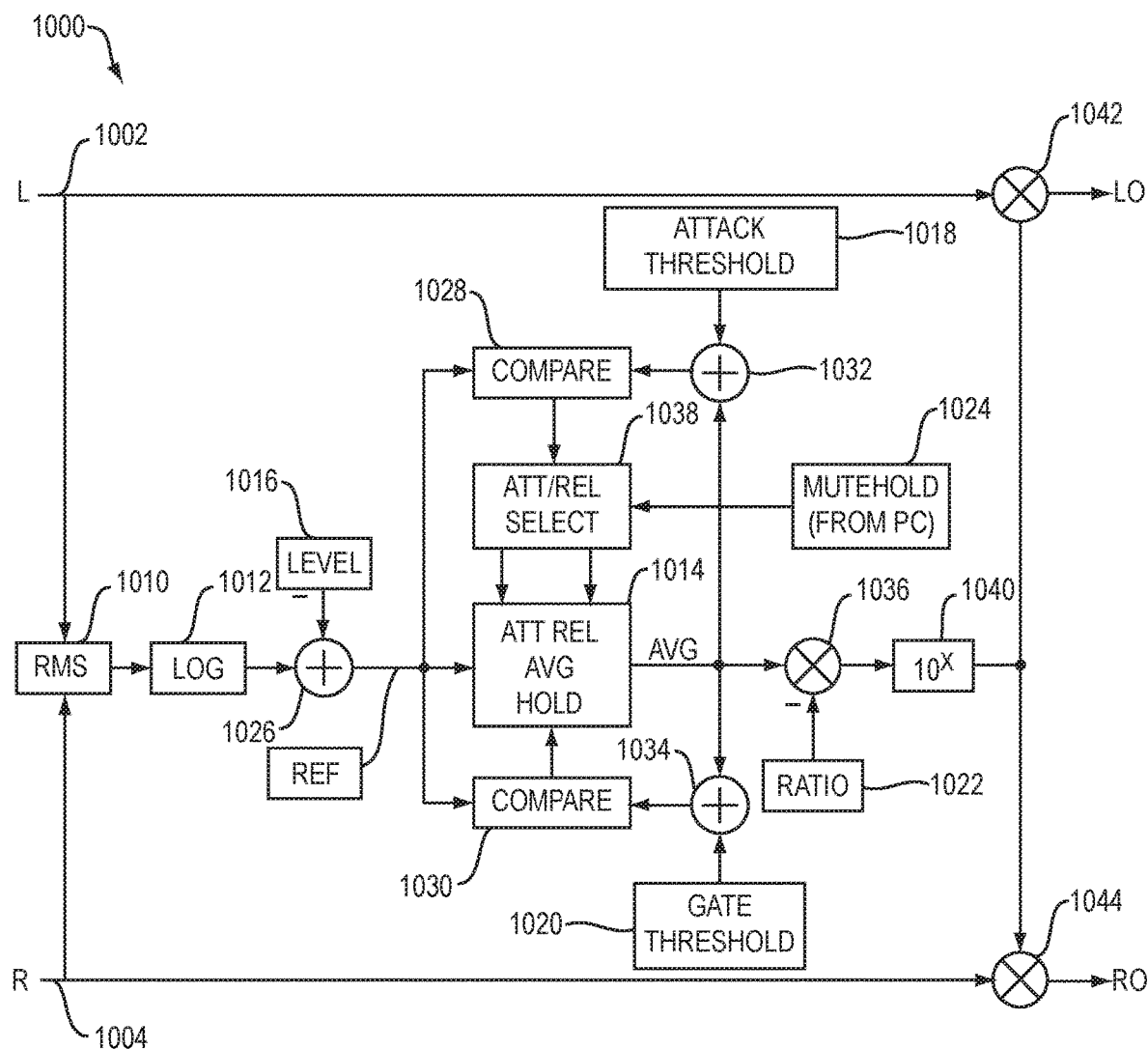
FIG. 10 depicts a diagram of an exemplary embodiment of a single compressor in accordance with the present disclosure.

FIG. 10 depicts a diagram of an exemplary embodiment of a compressor architecture (or, system) 1000, e.g., as can be used for Compressor1, Compressor2 and/or Compressor3 for the embodiment of FIG. 8 (DVC system 800). A detailed description of similar compressor architecture is provided in co-owned U.S. Pat. No. 8,315,411. As shown in FIG. 10, architecture 1000 receives two input signals, a left signal L at input 1002 and a right signal at input 1004. In exemplary embodiments, the DVC system architecture may be based upon a digital implementation of a classic compressor design (THAT Corporation Design Note 118) with flexibility and additional modifications that are only possible in a digital implementation. Architecture or system 1000 may also be referred to a DVC architecture or system.

Architecture 1000 can include an RMS level detector 1010 for providing a signal representative of the sum of the RMS averages of the left and right signals L and R, log conversion block 1012, and a signal averaging AVG block 1014. Log conversion block 1012 converts the output of the RMS level detector 1010 from the linear to the logarithmic domain. System 1000 is responsive to a number of control signals each indicative of whether a certain condition exists requiring a response from the system. The system 1000 may also include a host processor (not shown) configured and arranged for carrying out the operating of the DVC system 1000. The illustrated embodiment is responsive to a number of control signals including: a target level signal provided by the target signal generating device 1016, an attack threshold signal generated by the attack threshold signal device 1018, a release threshold (not shown), a gate threshold signal generated by the gate threshold signal device 1020, an attack ratio threshold (not shown), a release ratio threshold (not shown), a ratio signal generated by the ratio signal device 1022, and a mute hold signal generated by mute hold device 1024 responsive to a program change detector (PCD—not shown). Devices (or components) 1016, 1018, 1020, 1022 can simply be adjustable user controls accessible to the user. Device 1024 can be arranged to receive a signal from the TV controls when the channel changes or from a mute detector (not shown) that detects if inputs 1002 and 1004 have both been muted. The target signal level 1016 represents the level in dB, relative to a full scale input, that is the target volume. The attack threshold 1018 represents the number of dB that REF (output of summer 1026) must be above AVG before the attack time is reduced by a factor of N, where N can be any number. In one illustrated embodiment N=10.

The release threshold signal preferably represents the number of dB that REF must be below AVG before the release time is reduced by a factor of M, where M can be any number, and in one illustrated embodiment M=10. The Gate threshold 1020 represents the amount (e.g., a negative dB number) that REF can go below AVG before all left and right gain adjustments are frozen. The attack ratio threshold represents the absolute amount, in dB, that REF can go above the target signal level 1016 before the volume control begins attenuating the input signal. The release ratio threshold represents the absolute amount, in dB, that REF can go below the target signal level 1016 before the volume control begins adding gain to the input signal. The ratio signal 1022 adjusts the AVG value by the desired compression ratio.

Target level signal 1016 is subtracted from the output of log conversion block 1012 by signal summer 1026 so as to provide the REF signal to the signal averaging AVG block 1014, a comparator 1028 and a second comparator 1030. The REF signal represents the volume level of the input signal relative to the desired listening threshold. The AVG signal can also be thought of as the instantaneous (prior to attack/release processing) ideal gain recommendation. The output of the signal averaging block 1014 is the AVG signal, which is a signal that is a function of the average of the REF signal. The AVG signal is applied to the signal summer 1032 where it is added to the attack threshold signal 1018. In a similar manner (not shown) the AVG signal is summed with a release threshold. The AVG signal is also applied to the signal summer 1034 where it is added to the gate threshold signal 1020. The output of signal summer 1032 is applied to attack threshold comparator 1028 where it is compared to the REF signal, while the output of signal summer 1034 is applied to gate threshold comparator 1030 where it is compared to the REF signal. The AVG signal is also multiplied by the ratio signal 1022 by the signal multiplier 1036. The output of comparator 1028 is applied to the attack/release selection block 1038, which in turn provides either an attack (ATT) signal, or a release (REL) signal to the signal averaging block 1014, dependent on and responsive to the status of the mute hold 10 signal 1024. The output of the release threshold AVG summer (not shown) is also compared to the REF signal and is applied to the attack/release selection block. The comparator 1030 provides an output to the HOLD input of signal averaging block 1014. Finally, the signal multiplier 1036 provides an output to a log-to-linear signal converter 1040, which in turn provides an output which is applied to each of the signal multipliers 1042 and 1044, wherein it respectively scales the left and right signal provided at the corresponding inputs 1002 and 1004 so as to provide the output modified left and right signals Lo and Ro.

With continued reference to FIG. 10, the RMS level detector 1010 senses the sound level of the input signal. It should be noted that while an RMS level detector is shown, any type of signal level detector can be used. For example, a peak detector, average detector, perception based level detector (such as the ITU 1770 loudness detector or the CBS loudness detector), or other detector can be used to sense the sound level. These level detectors usually have time constants which are dynamically and independently adjustable. One method of adjusting these time constants is to base them on the envelope or general shape of the input signal so that the time constants vary with the signal. In other embodiments, the time constants are fixed. For ease of data processing, the sound level can be converted into the log domain, as shown, using log conversion block 1012. In a multi-band system, a separate RMS detector can be used for each band. The signal averaging block 1014 is configured and arranged so as to compute the average of REF relative to the attack and release times. The output signal AVG of the signal averaging block 1014 is adjusted by the desired compression ratio, via multiplier 1036, to create the gain value to be applied. Finally the gain is converted back into the linear domain by the log-to-linear converter 1040 for application to the left and right signals L and R so as to produce the modified left and right signals Lo and Ro.

A target output level represented by the target level signal 1016 is subtracted from the sensed level at the output of the log conversion block 1012 to determine the difference between the actual and desired sound level. This difference, which represents the level of the input signal relative to the target level signal 1016, is known as the reference (REF) signal. The target level signal can be a user input, such as a simple knob or other pre-set setting, so as to control the level of sound desired. This threshold can be fixed or it can be changed as a function of the input signal level to better position the compression relative to the input dynamic range. Once REF signal is obtained, it is provided as an input to the averaging block 1014, attack threshold comparator 1028 and gate threshold comparator 1030. The output of attack threshold comparator 1028 is applied to the attack/release select block 1038, which in turn can receive a signal (e.g., a MuteHold signal 1024) from a program change detector.

The gate threshold signal 1020 when added to the current average AVG represents the lowest value REF is able to achieve before left and right gain adjustment (1042 and 1044) are frozen. The gate threshold comparator 1030 receives the instantaneous signal level (REF) signal and determines if the sound level represented by REF drops below the given aforementioned threshold. If the instantaneous signal level (REF) is more than the amount of the gate threshold below the averaged signal level (AVG) appearing at the output of block 1014, the gain applied to the signal in the signal path is held constant until the signal level rises above the threshold. The intent is to keep the system 1000 from applying increased gain to very low level input signals such as noise. In an infinite hold system, the gain can be constant forever until the signal level rises. In a leaky hold system, the gain can be increased at a gradual pace (much slower than the release time). In one embodiment, this gate hold threshold is adjustable, while in another embodiment the threshold set by gate threshold 1034 is fixed. A detailed description of similar suitable compressor architecture is provided in co-owned U.S. Pat. No. 8,315,411, which is incorporated by reference herein in its entirety.

The architecture 1000 preferably (but not necessarily) has an adjustable maximum limit to the gain applied to the L and R channel. By limiting the maximum gain, one can minimize the effects of compressor overshoot when the source material transitions from very quiet to very loud such as when a television program transitions to a loud commercial. Additionally, a maximum gain limit allows one to minimize the noise boost that can occur when the audio is quiet. This is especially important for analog input sources or older program material that has a high noise floor.

In some embodiments, the DPP 802, Crossover Network1 804, Compressor1 806 and Compressor2 808 components can be configured as a volume control with multi-spatial processing protection similar to as described in U.S. Pat. No. 8,315,411. Examples of suitable compressor blocks (or, architectures or subsystems) include, but are not limited to, those disclosed in co-owned U.S. Pat. No. 8,315,411.

The Volume Control 826 setting is provided to Compressor1 and Compressor2 (dashed line on FIG. 8) as an optional means to automatically adjust the Compressor target level 1016 as a function of the system Volume Control setting. This Volume Control feedback would be valuable if the compressors were configured as signal level limiters with high compression (1000:1 ratio) above threshold and no compression (1:1 ratio) below threshold. As the volume level is decreased the feedback would allow the compressor target level to increase thus ensuring that the maximum allowed signal level is always possible at the speaker terminals. Conversely, as the volume level increases the compressor targets can be lowered to ensure that the maximum allowed signal will not be exceeded at the speaker terminals.

Figure 11A:
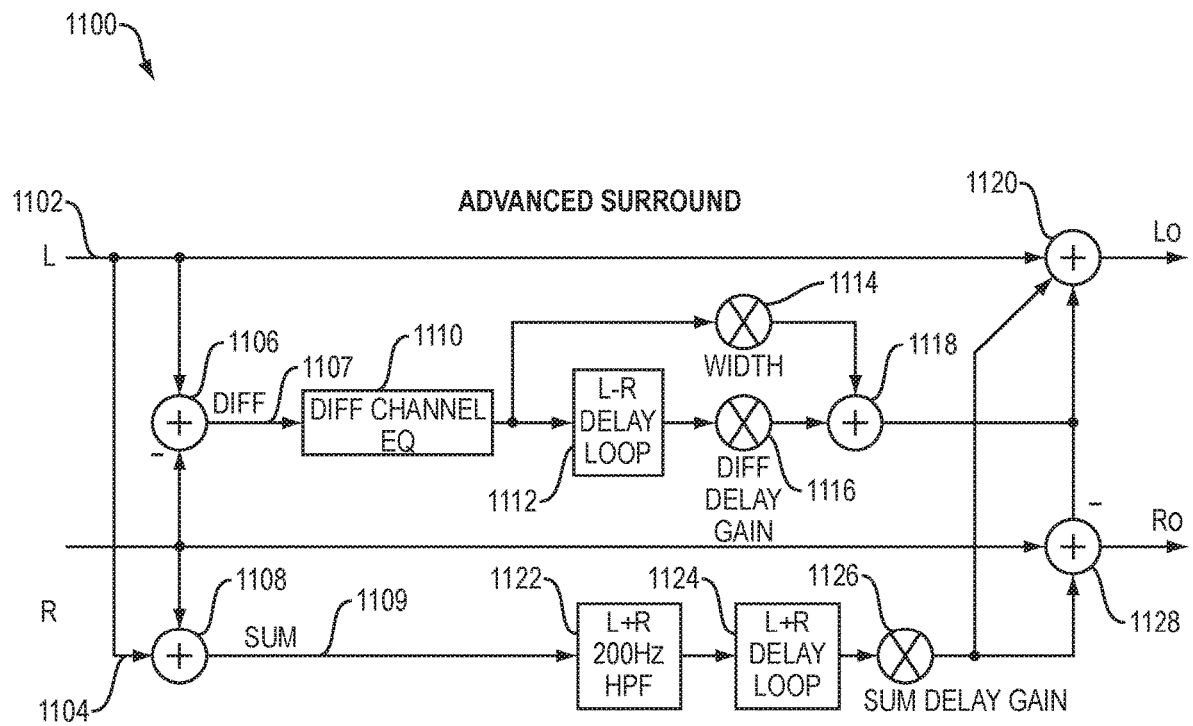
FIG. 11A depicts a diagram of an exemplary embodiment of an advanced surround (AS) architecture in accordance with the present disclosure.
Figure 11B:
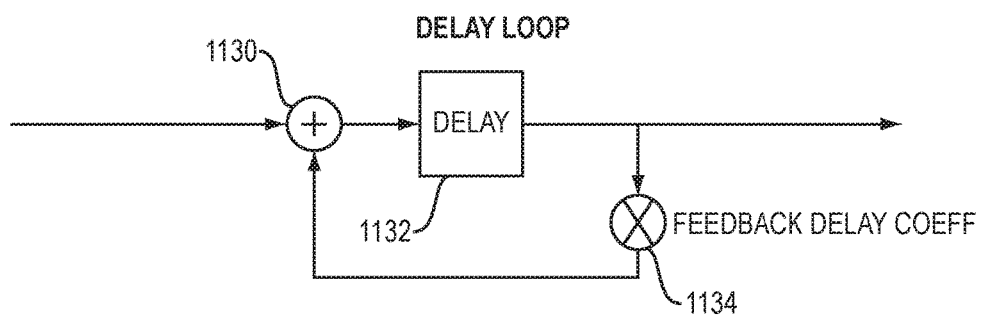
FIG. 11B depicts a diagram of an exemplary delay-loop in accordance with the present disclosure.

FIG. 11A depicts a diagram of an exemplary embodiment of an Advanced Surround architecture/system 1100. FIG. 11B shows a detailed diagram of the delay loop. Architecture 1100 includes left and right channels 1102 and 1104; signal flows are indicated by arrows. As shown in FIG. 11A, the Advanced Surround architecture 1100 includes summers (summing units) 1106 and 1108, each of which receives the Left and Right channels 1102 and 1104. Summer 1106 is configured to invert one input so it effectively acts as a subtracting unit. The summing units 1106 and 1108 produce difference 1107 and sum 1109 channels as outputs, respectively. Difference EQ 1110 in the difference channel 1107 preferably focuses on middle frequencies, which are the ones the human ear is most sensitive to; it may be desirable in some applications to single out or separate out those so they will dominate the spatialization, spreading and adding multiple dimensions to the spatialization. The difference channel also includes a delay loop 1112 and multipliers 1114 and 1116 for impressing width and gain inputs/values; summer 1118 is also present to combine the width adjusted difference channel with the diff delay gain adjusted difference delay output. The sum channel 1109 can include a HPF filter 1122 to filter out low frequency signals as those signals typically do not add much to perceived spatialization; HPF filter 1122 is preferably present but is optional. The sum channel 1109 can also include a delay loop 1124 and a summer 1126 for setting (impressing) a delay gain. Summing units 1120 and 1128 are also present.

Referring to FIG. 11B, an exemplary embodiment of a delay loop, e.g., 1112 and 1124 in FIG. 11A, is shown. The delay loop can include a summer 1130, a delay unit 1132, and a multiplier 1134 for setting or impressing a feedback delay coefficient. Other architectures may be used for delay loops within the scope of the present disclosure. The Delay Loop architecture is repeated as the L−R Delay Loop and L+R Delay Loop. The Advanced Surround parameters Width, Diff Delay Gain, Sum Delay Gain, Delay (in Delay Loop) and Feedback Delay Coefficient (in Delay Loop) all correspond to adjustable parameters. Setting the Diff Delay Gain and Sum Delay Gain to zero (i.e., no signal passes) transforms the algorithm to be similar to a pseudo-surround two channel processing algorithm as disclosed in co-owned U.S. patent application Ser. No. 12/949,397, which algorithm is typically used in many consumer electronics applications. Co-owned U.S. patent application Ser. No. 12/949,397 filed 18 Nov. 2010 and entitled "Virtual Surround Signal Processing" is incorporated in its entirety herein by reference. With continued reference to FIGS. 11A and 11B, the Width parameter adjusts the level of sound field spread as is traditionally done. The Delay Loop provides an example of a means to model near and far reflections of both the Sum and Diff signals.

Figure 12:
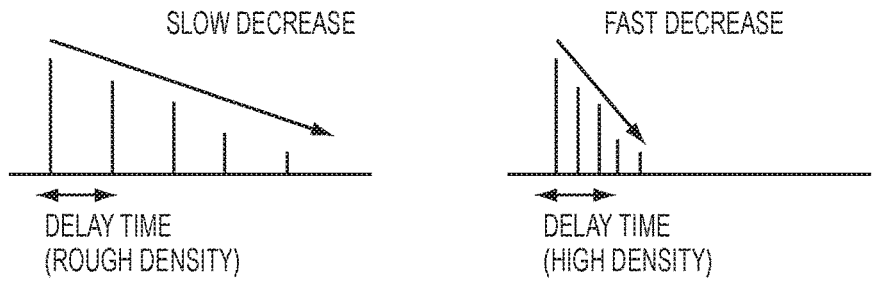
FIG. 12 depicts examples of delay-loop configurations according to an embodiment of the present disclosure.
Figure 12:

FIG. 12 provides more detail on how one might configure the sum and difference delay loops for exemplary embodiments. FIG. 12.1 shows how to configure the Delay, e.g., for 20 ms or 30 ms based upon a 48 kHz sample rate; other sampling rates may of course be utilized. FIG. 12.2 shows the impact of the Delay and feedback coefficient settings on the Delay Loop impulse response. The Delay setting determines the time gap between the non-zero values of the impulse response. For stability, the absolute values of the Feedback Delay Coefficients are preferably limited to values greater than or equal to 0 and less than 1; other coefficients may be used, however. The higher the absolute value of the Feedback Delay Coefficient, the slower the decrease of the impulse response. FIG. 12.3 defines the early reflection and reverb areas of an acoustic impulse response. One can see that by appropriate choice of the Delay, Feedback Delay Coefficient and the Delay Gain the impulse response of the L+R and L−R can be independently configured to position energy, as needed, in the early reflection and late reflection (reverberant) regions.

This architecture allows the summation of a scaled amount of sum and difference reflection/reverb with processing before the entire signal is combined back with the left and right channels. Prior art algorithms may be adequate for spreading the perceived sound field, for two stereo speakers, in the horizontal direction. The addition of reflection/reverb modelling, as shown in FIGS. 11A and 11B, adds depth, some height and additional width perception to the virtual sound field resulting in a perceived 3D sound effect. The trade-off in providing this width/depth/height expression, via digital delay reflection and reverb modelling, is audio clarity. It preferably is used with less emphasis (subtly) when the desire is to provide more fidelity to inexpensive speakers; and, it preferably is used with emphasis (more strongly) when the desire is to create the ambience of a concert hall, theater or sporting event. It should be noted that more sophisticated reflection/reverb modelling techniques can be used, such as those that model the impulse responses of theaters and concert halls, to produce an even more configurable and pleasing effect (though with much increased implementation complexity).

Figure 13:
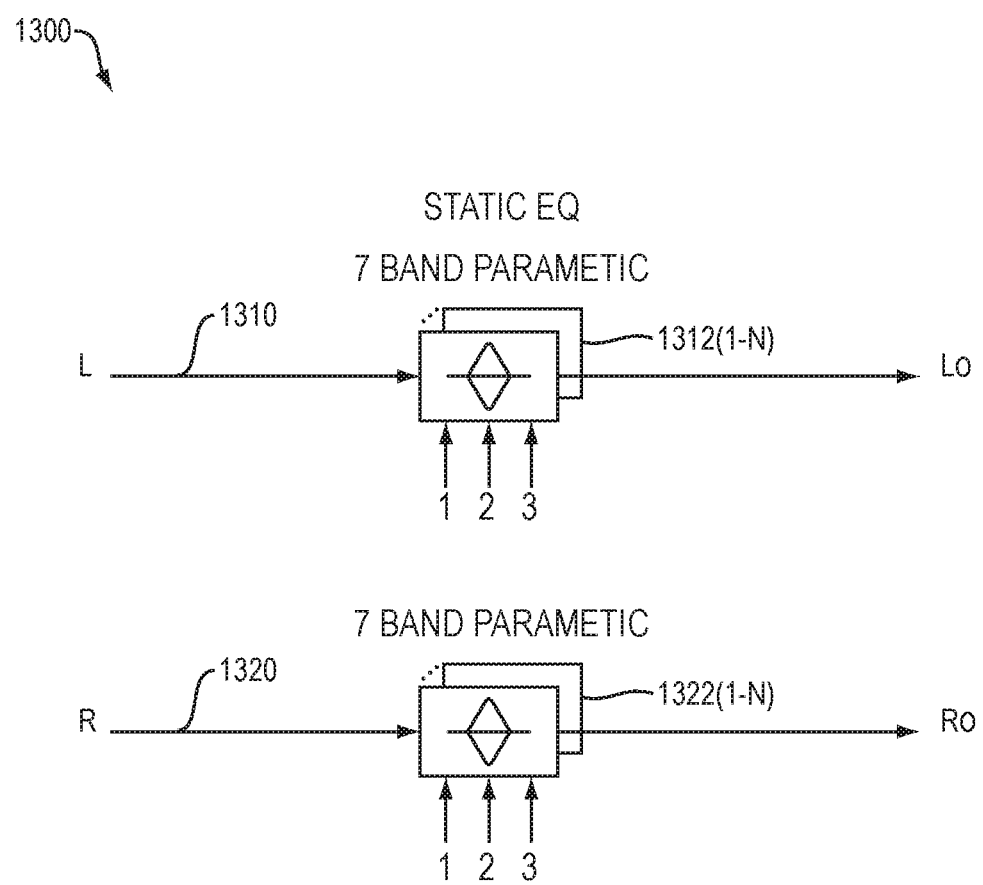
FIG. 13 depicts a diagram of an exemplary embodiment of a static equalizer (EQ) in accordance with the present disclosure.

FIG. 13 depicts a diagram of an exemplary embodiment of the Static EQ 1300. Left and right channels 1310 and 1320 are indicated as having configurable parametric EQ 1312 and 1322, respectively. In the embodiment shown, seven configurable parametric EQ second-order sections are configured in both left and right channels. Of course, other embodiments of a static EQ, e.g., of different order (e.g., $3^{rd}$, $4^{th}$, $5^{th}$, $6^{th}$, $7^{th}$, $8^{th}$, etc.) and number of sections (e.g., 1, 2, 3, 4, 5, 6, etc.) may be utilized within the scope of the present disclosure; moreover, dynamic EQ may be used in addition or substitution.

One preferred embodiment of Compressor3 involves Volume Control feedback. The Volume Control setting can be provided, as feedback, to Compressor3 818 (dashed line on FIG. 8) as an optional means to automatically adjust the Compressor target level (Level 1016 in FIG. 10) as a function of the system Volume Control setting. For example, this volume level feedback is useful when Compressor3 818 is configured in a bass enhancement configuration. As the volume level is decreased the feedback would allow the compressor target level to increase thus ensuring that the maximum bass level is always possible at the speaker terminals. Conversely, as the volume level increases the compressor targets can be lowered to ensure that the maximum allowed bass level will not be exceeded at the speaker terminals. An embodiment utilizes Compressor2 808 in conjunction with Compressor3 818 to provide even better system bass response in a bass-emphasized music configuration. A diagram of another exemplary embodiment of Crossover Network2 816, Compressor3 818 and HPF 820, in a Bass Enhancement configuration, is described in detail in co-owned U.S. Pat. No. 8,315,411, the entire content of which is incorporated herein by reference.

The preferred instantiation of the Soft Clipper is a hard limiter followed by a smoothing polynomial. Suitable smoothing polynomials include, but are not limited to, the type described in the paper Esqueda, F., et al., 23rd European Signal Processing Conference, "Aliasing reduction in soft-clipping algorithms," EUSIPCO 2015 (Dec. 22, 2015): 2014-2018, a copy of which is submitted with and incorporated into this application; one such suitable the polynomial is $y=(3x/2)(1-x^2/3)$, where y is the clipper output, is utilized in a preferred static soft clipping instantiation. Other smoothing polynomials and methods may be used, e.g., other methods based on the ideal bandlimited ramp function (BLAMP), or the polyBLAMP polynomial approximation method, etc. A hard clipper alone can produce a harsh audio artifact during compressor overshoot. A true limiter may be computationally intensive and require significant processor bandwidth and memory. A soft clipper represents a good compromise that minimizes the perceived audio artifacts for brief audio excursions above full scale.

This configurable multi-compressor (e.g., three-compressor) system can be utilized to enhance the listener experience for different types of program material. For example, it can be configured in a music mode with an emphasis on bass. It can be configured in a concert hall mode with emphasis on echo and reverberation. It can also be configured in a live sporting event mode that emphasizes the announcer's voice while maintaining the ambience of a stadium environment. There are many other possible configurations such as HiFi, News and Theater modes, etc.

Embodiments of the present disclosure can accordingly improve the fidelity and perceived sound field spread of inexpensive, cabinet mounted, stereo speakers such as those that might be found in televisions, wireless speaker systems and sound bars. Embodiments of the present disclosure can improve inexpensive, cabinet mounted, stereo speakers by providing, e.g., (i) an Advanced Surround algorithm that adds depth and height to the left/right/center sound field images, (ii) a Soft Clip algorithm to minimize the perceived artifacts caused by compressor overshoot, (iii) configurable crossover filter order adjustment to allow better isolation between bands, (iv) a compressor maximum gain adjustment to reduce overshoot and minimize noise boost, and/or (v) a center gain adjustment to emphasize the perception of the center image (dialog) in high ambient sound situations.

It may be desirable to have different configurations of or settings (adjustments) of these architectures and/or algorithms, depending upon the type of audio equipment or source material. For example, while watching an action movie, a listener may be interested in a strong audio surround effect. Embodiments of the present disclosure can accordingly provide enhanced audio surround effect(s). As another example, when listening to music, a listener may be less interested in a surround effect and more interested in high fidelity, a concert hall effect, or increased bass. A listener to a sporting event may be interested in hearing the announcer clearly over the crowd noise and public address system while still trying to maintain the ambiance of a stadium environment. The improvements and configurability of the architectures and algorithms of the present disclosure can thus provide the implementation of multiple audio enhancement modes to facilitate different types of audio material and the listener's taste.

Listening Modes: exemplary embodiments including exemplary listening modes are described below with respect to features and components described above and shown in the drawings; other listening modes may of course be realized in accordance with the present disclosure.

Music Mode:

An example of a bass-emphasized music mode will now be described. An exemplary music mode can be created by the following configurations and settings; others may be used within the scope of the present disclosure. It is assumed that the system utilizes an inexpensive set of speakers which have a low-end frequency response that extends to, e.g., about 250 Hz. This mode can utilize two compressors (Compressor2 and Compressor3) and EQ to enhance bass.

Figure 14:
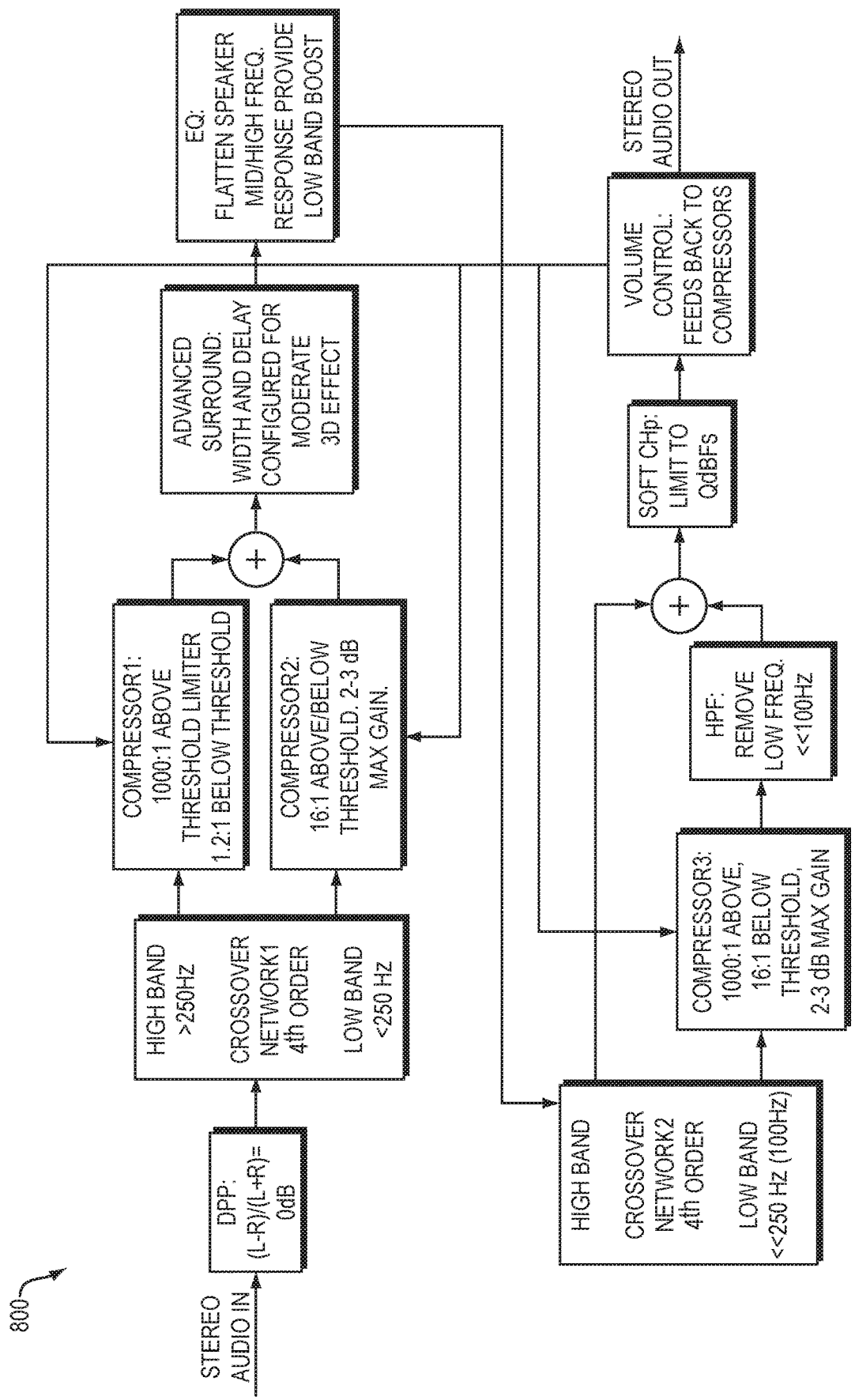
FIG. 14 shows an example of the Multi Band Compressor Architecture of FIG. 8 configured in bass-emphasized music mode.

FIG. 14 shows an example of the Multi Band Compressor Architecture 800 of FIG. 8 configured in a bass-emphasized music mode ("MUSIC Mode"). An example bass-emphasized music mode configuration is described below.

For the MUSIC Mode, the DPP 802 may be configured to limit the (L−R)/(L+R) ratio to 0 dB. Compressor1 806 may be configured separately to limit the level in the mid and high bands. In this example those are signals above, e.g., 250 Hz. The high band (>250 Hz) Above Threshold Ratio (compression ratio) is set to 1000:1 to provide true limiting at the Target Level. The Target Level 1016 (FIG. 10) is determined, while monitoring the speaker output, with the EQ 814 configured and with the TV Volume Control 826 set at full volume to determine the maximum allowable signal. The Target Level 1016 will increase proportionally, via internal feedback, as the TV volume is decreased. In other words, the high band compressor will allow more energy to pass as the volume control is lowered since it will be attenuated by the volume control prior to being present at the speaker terminals. The Max Gain and Below Threshold Ratio setting (e.g., 1.2:1) will allow some mid and high band boost to occur when the input level, in conjunction with the TV volume control 826 setting, indicates more energy will be tolerated. In other words the high band compressor will allow more mid and high frequency energy as the volume control is lowered since it will be attenuated by the volume control prior to being present at the speaker terminals.

Compressor2 808 may be configured to limit (or boost) the level in the low band relative to a target level setting. In this case the low band could be 250 Hz and below. Crossover Network1 804 is configured at 250 Hz. The filter order is set to $4^{th}$ to optimize the separation of the two bands (<250 Hz and >250 Hz). The Target Level 1016 (FIG. 10) sets the limit, for this band, in dB full scale. The Target Level 1016 is set, while monitoring the speaker output, with the Volume Control 826 at full volume and with the EQ 814 configured with any desired static boost <250 Hz. Setting the Target Level 1016 in this manner allows the maximum amount of energy <250 Hz allowable (before distortion occurs) to reach the speaker terminals at full volume. At lower volume settings the Volume Control feedback will allow more bass signal to pass. This configuration allows the system to always pass as much bass signal as possible, without distortion, while utilizing EQ to provide a static boost to the low band. The Maximum Compressor Gain could be set to a low value (e.g., 2-3 dB) to allow a small amount of additional dynamic boost at low bass input levels. Above and below threshold compression ratios are set relatively high (e.g., 16:1).

The Advanced Surround 812 may be configured with a moderate to small amount of sound field spread (Width) with a Delay, Delay Feedback and Delay Gain configuration that is dominated by early reflections giving the subtle feeling of 3D sound without sacrificing clarity. The EQ 814 may be configured to flatten the speaker frequency response in mid to high bands and to boost the response in the low band. This creates good overall tonal balance while providing the desired amount of bass boost.

Compressor3 118 may be configured to limit very low frequency signals (<<250) that are not passable by the speakers at high, or even moderate, output levels. This lower low band is set in Crossover Network2 804, for example, it is set to 100 Hz. The Target Level can be set to a level (lower than the Compressor2 808 Target Level 1016) that will allow these very low frequency signals to still pass (at limited levels) and even boost them, via the Max Gain and Below Threshold Ratio parameters, if the input signal level and volume control 826 setting will allow. The Target Level is set when the TV is at full volume, while monitoring the speaker output, to determine the maximum allowable signal but will then be increased proportionally, via internal feedback, as the TV volume is decreased. In other words the low-low band compressor will allow more energy to pass as the volume control is lowered since it will be attenuated by the volume control prior to being present at the speaker terminals. The HPF is preferably configured to remove those extremely low frequencies that absolutely cannot be reproduced by the speaker. Soft Clip 824 may be configured to limit signals above 0 dB full scale. By dividing the speaker low band into two bands, the configuration described above allows lower than typical frequencies to be passed by the speakers. In prior art, a HPF would typically be used to remove the lower-low band frequencies from the audio signal. This new compressor configuration allows them to be passed if conditions (low input level, low volume control setting) merit. All these parameter settings are calibrated for a given set of speakers mounted in a specific enclosure.

Concert Hall Mode:

An exemplary concert hall mode can be created, for the example speaker(s), by the following configurations and settings; others may be used within the scope of the present disclosure.

DPP 802: Same as bass-emphasized music mode. Compressor1 806: Same as bass-emphasized music mode. Compressor2 808: Same as bass-emphasized music mode. EQ 814: Same as bass-emphasized music mode. Compressor3 818: Same as bass-emphasized music mode. Soft Clip 824: Same as bass-emphasized music mode.

Advanced Surround 812: Increase the Delay Time and Delay Feedback Coefficient for both the L+R and L−R channels so that the overall impulse response extends well into the reverberation region.

Broadcast Sports Mode (Sports Mode):

An exemplary broadcast sports mode can be created by the following configurations and settings; others may be used within the scope of the present disclosure. In exemplary embodiments, the above-described architecture(s), e.g., as depicted for FIGS. 8-14, can be configured specifically in a Sports Mode tuning for broadcast events that occur in stadiums, arenas, etc., where there is dialogue (e.g., announcers, commentators, etc.) and typically a considerable amount of unpredictable ambient noise (e.g., cheering crowds). The Sports Mode can operate to reduce the amount of ambient audio, to bring attention to the dialogue, but then processing the vestige of difference signal that remains, after DPP processing, with a reverb effect, to create a subtle perception of a stadium.

DPP 802: Limit the (L−R)/(L+R) ratio to, e.g., −12 dB. This setting reduces the ambient audio (such as crowd noise, public address announcer, etc.). Increase the Center Gain (via multiplier 916) to emphasize the broadcast announcer's voice. This gives the announcer's voice more perceived clarity without sacrificing the overall bandwidth of the audio signal. As a result the difference signal is attenuated in high ambient-noise environments (e.g., stadiums, arena etc.). In contrast, prior art techniques/systems have simply implemented a bandpass filter to pass voice frequencies while attenuating signals outside of the voice range; but, without additional processing the sporting event ambience can be lost, resulting in a loss of the live sporting event ambience and/or less clarity in the broadcast announcer's voice, which is something that has been observed with the prior art. Crossover Network1 804, Compressor1 806 and Compressor2 808 can be configured in a dynamic volume control (DVC) configuration.

Advanced Surround 812: Configure L−R Delay loop (Delay and Delay Feedback Coefficient) to generate an impulse in the reverberation region. Disable L+R delay loop 1124 by setting the sum delay gain to, e.g., 0. While the L−R channel is reduced by the DPP—forming a reduced remaining difference signal, the reverberation on the reduced remaining difference signal restores the enveloping feel of stadium crowd noise without sacrificing the clarity of the broadcast announcer. Disabling the L+R delay loop 1124 can help maintain the broadcast announcer's vocal clarity. EQ 814: Configure to compensate for speaker frequency response and to provide bass boost.

Compressor3 818: Configured to improve the speaker's bass response by limiting (or boosting) the level in the low band relative to a target level setting. The Target Level 1016 is set with the Volume Control at full volume and with the EQ fully configured with the desired low bad boost. Setting the Target Level in this manner allows the maximum amount of energy (before distortion occurs) to reach the speaker terminals at full volume. At lower volume settings the Volume Control feedback will allow more bass signal to pass. This configuration allows the system to always pass as much bass signal as possible, without distortion, while utilizing EQ to boost the low band. The HPF is configured to remove the low frequencies that cannot be reproduced by the speaker in this configuration. Soft Clip 824: Configured to limit signals above, e.g., 0 dB full scale.

In exemplary embodiments (not just applicable to a broadcast sports mode), another included feature is volume control feedback (VCF) to dynamically adjust the target levels for the three compressors. This may be needed or desirable when the Volume control is positioned after a compressor that is configured to function as a limiter. The TV Volume Control signal or setting can be provided, as feedback, to a compressor as an optional means to automatically adjust the Compressor target level as a function of the system Volume Control. For example, this volume level feedback is useful when Compressor3 818 is configured in a bass enhancement configuration. As the volume level is decreased the feedback would allow the compressor target level to increase thus ensuring that the maximum bass level is always possible at the speaker terminals. Conversely, as the volume level increases the compressor targets can be lowered to ensure that the maximum allowed bass level will not be exceeded at the speaker terminals.

Exemplary Clauses

Clause 1: A system for enhancing stereo audio adjustment in TV sets, the system including: a sound processing system configured to provide audio controls to modify the characteristics of the processed audio; a display for observation by a user and configured to display volume control information and sound settings corresponding to user-selectable sound processing characteristics; and a control device configured to adjust the sound processing characteristics in response to user input; and, activation means to activate the display via a single selection on the control device.

Clause 2: The system of clause 1, wherein the system is configurable to produce a desired sound listening mode.

Clause 3: The system of clause 1, wherein the system is configurable to change the characteristics of a given sound listening mode.

Clause 4: The system of clause 2, further including: a dual processing protection (DPP) processor configured to limit the audio difference to sum ratio (L−R)/(L+R) by (i) attenuating the audio difference signal, producing a reduced remaining difference signal, and (ii) adjusting the level of the sum signal; and wherein the desired listening mode is an audio processing configuration operative to enhance a listener's perception of a center image in stereo audio, while maintaining a perception of a surrounding difference channel.

Clause 5: The system of clause 4, further including a two channel surround processor configured to set the amount of perceived sound field spread in multiple dimensions by filtering the reduced remaining difference signal from the DPP processor and generating perceived audio reflections of the filtered signal.

Clause 6: The system of clause 2, wherein the sound processing system includes: an equalizer configured to shape the input audio frequency response for the desired spectral characteristics; a crossover network to divide the input audio into two bands, the first band being the lower band and the second band being the upper band; a first compressor for processing the first band configured to produce output signals responsive to the energy level of the lower band frequency portion of the input audio signal; a second compressor for processing the second band configured to produce output signals responsive to the energy level of the upper band frequency portion of the input audio signal; a third compressor with a configurable target level determined dynamically by system volume control feedback; a high pass filter configured to remove frequencies that cannot be reproduced by the loudspeaker; a summer to recombine first and second bands; and a soft clipper operative to limit the perceived distortion of left and right audio signals that briefly exceed a full scale output.

Clause 7: The system of clause 2, wherein the sound processing system includes at least one compressor with a configurable target level determined dynamically by system volume control feedback; and a volume control positioned after the compressor.

Clause 8: The systems of any of the foregoing clauses in any combination.

Accordingly, from the above-given description and accompanying drawings, it will be apparent that this technology described herein can allow, among other things, a user (viewer) to adjust the sound mode and sound configuration, on a program-by-program basis, without taking a deep dive into the on-screen menu hierarchy. This technology described herein (disclosed invention) gives the typical viewer more control of the TV audio configuration and makes the viewing experience much more pleasurable.

The components, steps, features, objects, benefits, and advantages that have been discussed are merely illustrative. None of them or the related discussions are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, in bass-emphasized MUSIC Mode the roles of Compressor2 and Compressor3 could be reversed. Compressor2 could compress the lower low band and Compressor3 could compress the upper low band. Additionally, the HPF could be located after the summer. The Volume Control could be positioned before Crossover Network2 eliminating the need for Volume Control feedback.

Unless otherwise stated, all measurements, values, ratings, positions, magnitudes, sizes, and other specifications, including frequencies, ratios, and dB values, that are set forth in this specification, including in the claims that follow, are approximate and/or provided as example, are not necessarily exact or invariable. They (the values described) are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A system for enhancing stereo audio adjustment in a TV set having two or more speakers, the system comprising:
   a volume control configured to adjust or mute a volume of a TV set, wherein the volume control is further configured to adjust sound processing characteristics in response to user input;
   a dual processing protection processor (DPP) operative to receive left (L) and right (R) signals from left (L) and right (R) audio channels, respectively, as inputs and configured to limit the audio difference to sum ratio (L−R)/(L+R) by attenuating the audio difference signal (L−R), thereby producing an attenuated difference signal, and increasing the level of the sum signal (L+R), wherein the level of the sum signal (L+R) represents center gain corresponding to a center image relative to the two or more speakers, wherein the dual processing protection processor is operative to produce left and right output signals for the TV set;
   at least one crossover network configured to receive left and right input signals and to separate each of the left and right input signals into a plurality of frequency bands, including a high band and a low band, wherein the at least one crossover network produces left and right output signals for each band and wherein the at least one crossover network is configurable by a user to set a crossover frequency and filter order of the crossover network;
   first and second compressors, wherein the first compressor is configured to receive the left and right high band output signals from the first crossover network and to produce compressed left and right high band output signals corresponding to the high band, and wherein the second compressor is configured to receive the left and right low band output signals from the first crossover network and to produce compressed left and right low band output signals corresponding to the low band, and wherein the first and second compressors are configured to limit a level of the high and low bands;
   a two-channel surround processor configurable to receive the outputs from the first and second compressors and set an amount of perceived sound field spread in multiple spatial dimensions based on the attenuated difference signal (L−R) resulting from processing of the dual processing protection processor and to generate left and right output signals;
   a stereo equalizer configured to receive left and right audio input signals and shape the spectral characteristics such that the overall bandwidth of the audio material is not compromised when subjected to the playback on the two or more speakers, wherein the stereo equalizer is configured to produce left and right output signals;

a soft clipper operative to receive as inputs compressed stereo left and right input signals, wherein the soft clipper is configured to limit the perceived distortion of left and right signals that briefly exceed a full scale output when subjected to the center gain, and dynamics of the first and second compressors and to produce a stereo output;

a display for observation by a user and configured to display volume control information of the volume control and sound settings corresponding to user-selectable sound processing characteristics; and activation means to activate the display via a single selection on the control device.

2. The system of claim 1, wherein the system is configurable to produce desired sound listening modes.

3. The system of claim 1, wherein the filter order of the at least one crossover network is 4th order.

4. The system of claim 1, wherein the system further comprises a third compressor configured to limit the amount of low frequency audio energy in a band defined by a low frequency response of a speaker of the system, and with a limit threshold determined dynamically by a volume control setting of the system, and configured to dynamically boost the audio level when the audio level is below the limit threshold, wherein the system is configured for bass-enhanced music listening.

5. The system of claim 1, wherein the volume control is configured to receive a stereo input and to feed the volume control setting forward to at least one of the stereo compressors.

6. The system of claim 1, wherein the volume control is configured to receive a stereo input and to feed the volume control setting back to at least one of the stereo compressors.

* * * * *